United States Patent
Al Omari

(10) Patent No.: US 10,641,556 B1
(45) Date of Patent: May 5, 2020

(54) HEAT SINK WITH CONDENSING FINS AND PHASE CHANGE MATERIAL

(71) Applicant: UNITED ARAB EMIRATES UNIVERSITY, Al Ain (AE)

(72) Inventor: Salah Addin Burhan Al Omari, Al Ain (AE)

(73) Assignee: United Arab Emirates University, Al-Ain (AE)

( * ) Notice: Subject to any disclaimer, the term of this patent is extended or adjusted under 35 U.S.C. 154(b) by 0 days.

(21) Appl. No.: 16/396,104

(22) Filed: Apr. 26, 2019

(51) Int. Cl.
*F28D 15/02* (2006.01)
*F28D 15/04* (2006.01)
*F28D 20/02* (2006.01)
*H01L 23/427* (2006.01)

(52) U.S. Cl.
CPC ......... *F28D 15/02* (2013.01); *F28D 15/0266* (2013.01); *F28D 15/046* (2013.01); *F28D 20/025* (2013.01); *F28F 2215/06* (2013.01); *H01L 23/427* (2013.01); *H01L 23/4275* (2013.01)

(58) Field of Classification Search
CPC ...... F28D 20/02; F28D 20/021; F28D 20/023; F28D 20/025; F28D 15/02; F28D 15/0275; H01L 23/427; H01L 23/4275
See application file for complete search history.

(56) References Cited

U.S. PATENT DOCUMENTS

| | | | |
|---|---|---|---|
| 4,785,875 A | 11/1988 | Meijer | |
| 5,007,478 A * | 4/1991 | Sengupta | F28D 20/023 165/10 |
| 5,216,580 A | 6/1993 | Davidson | |
| 5,253,702 A | 10/1993 | Davidson | |
| 5,632,158 A * | 5/1997 | Tajima | F28D 15/0266 165/104.26 |
| 6,062,302 A | 5/2000 | Davis | |
| 6,085,831 A | 7/2000 | Digiacomo | |
| 6,410,982 B1 | 6/2002 | Brownell | |
| 6,490,160 B2 | 12/2002 | Dibene, II | |
| 6,714,413 B1 | 3/2004 | Ghosh | |
| 7,369,410 B2 | 5/2008 | Chen | |
| 10,043,732 B1 | 8/2018 | Al Omari | |
| 2002/0118511 A1 | 8/2002 | Dujari | |
| 2005/0028965 A1 | 2/2005 | Chen | |
| 2006/0237167 A1 | 10/2006 | Lee | |

(Continued)

*Primary Examiner* — Eric S Ruppert
(74) *Attorney, Agent, or Firm* — Richard C. Litman; Nath, Goldberg & Meyer

(57) ABSTRACT

The heat sink with condensing fins and phase change material is formed from a thermally conductive housing, an internal chamber, and a body of liquid phase change material. The thermally conductive housing has a first wall and an opposed second wall and forms an internal chamber. The first wall of the thermally conductive housing is adapted to be in direct contact with one or more heat sources. The body of liquid phase change material is disposed within the internal chamber. The second wall of the thermally conductive housing is adapted to form a plurality of condensing fins. The plurality of condensing fins may contain at least one high thermal conductivity rod. In some embodiments, a high thermal conductivity medium, such as gallium, is disposed within the internal chamber in direct contact with the first wall of the thermally conductive housing.

13 Claims, 8 Drawing Sheets

(56) References Cited

U.S. PATENT DOCUMENTS

| | | | |
|---|---|---|---|
| 2006/0293086 A1* | 12/2006 | Haws | B64G 1/50 455/561 |
| 2011/0083436 A1* | 4/2011 | White | F01K 3/08 60/670 |
| 2012/0120604 A1* | 5/2012 | Hao | H01L 23/427 361/701 |

* cited by examiner

HEAT SINK WITH CONDENSING FINS AND PHASE CHANGE MATERIAL

BACKGROUND

1. Field

The disclosure of the present patent application relates to heat sinks, and particularly to a heat sink with condensing fins and phase change material.

2. Description of the Related Art

As electronic technology continues to advance, electronic components, such as processor chips, are being made to provide faster operational speeds and greater functional capabilities. When a typical processor chip or a similar integrated circuit or modular circuit package operates at a high speed inside a computer or device housing, its temperature increases at a rapid rate. It is therefore necessary to dissipate the generated heat before any damage to the system may occur.

Conventionally, a heat sink is used to dissipate heat generated by a processor or the like. A conventional heat sink includes a base, which makes direct contact with the heat source, and a plurality of cooling fins. The heat sink dissipates heat by conduction through the base and into the fins, followed by convective cooling of the fins. However, as the power of electronic devices increases, so does the heat generated by their internal components, thus requiring heat sinks that are capable of dissipating heat far more effectively. For this reason, phase change material-type heat sinks have gradually begun to replace conventional heat sinks.

A typical phase change material-type heat sink has an evacuated cavity with a volume of working fluid sealed within the cavity. The phase change material-type heat sink transfers heat via phase transition of the working fluid. Thus, the phase change material-type heat sink has good heat conductivity and can quickly transfer heat from one place to another place. A typical phase change material heat sink may include a hermetically sealed container with a volume of water enclosed therein. The container is typically vacuum-exhausted, thus enhancing the evaporative effect of the water. The container includes a base for contacting the heat source, and a cover facing the base, typically with a plurality of cooling fins attached thereto. In use, heat produced by the heat source is conducted to the base, and this heat evaporates the water. The water vapor flows toward the cover and dissipates the heat thereto. This heat exchange condenses the water back into the liquid phase, which falls back toward the base, under the force of gravity, to continue the cycle. The heat transferred to the cover is radiated by the fins to the surrounding air.

Although such a phase change material-type heat sink is more efficient than a conventional heat sink, a typical water-based phase change material-type heat sink, as described above, is still limited in its effectiveness, primarily due to design considerations, such as thermal conductivity and heat capacity of the materials involved as functions of the physical dimensions of the heat sink.

Thus, a heat sink with condensing fins and phase change material solving the aforementioned problems is desired.

SUMMARY

In an embodiment, the present subject matter is directed to a heat sink with condensing fins and at least one phase change material. In an embodiment, the heat sink is formed from a thermally conductive housing, the thermally conductive housing having a first wall and an opposed second wall and the thermally conductive housing forming an internal chamber. The first wall of the thermally conductive housing is adapted to be in direct contact with one or more heat sources. A high thermal conductivity medium can be disposed within the internal chamber, in direct contact with the first wall. A body of liquid phase change material is disposed within the internal chamber. The second wall of the thermally conductive housing is adapted to form a plurality of condensing fins. One or more fans can be provided to blow air across the condensing fins.

In an embodiment, the second wall of the thermally conductive housing includes at least one extension, extending between each of the condensing fins to the high thermal conductivity medium, creating a plurality of sub-chambers, with each sub-chamber containing a portion of the body of liquid phase change material. In an embodiment, a partition wall separates the high thermal conductive medium from the body of liquid phase change material. In an embodiment, at least one high thermal conductivity rod is disposed within each of the sub-chambers. At least some of a plurality of side beams can connect each of the at least one high thermal conductivity rods to the second wall.

In an embodiment, the first wall and the second wall are angled toward the heat source and adapted to form two condensing fins. In an embodiment, at least one high thermal conductivity rod is disposed within the internal chamber and extends into the two condensing fins. At least some of a plurality of side beams can connect each of the at least one high thermal conductivity rods to the first wall or the second wall.

In use, heat generated by the heat source is transferred, via conduction, through the thermally conductive housing and into the body of liquid phase change material. The heat may cause at least a portion of the body of liquid phase change material to evaporate, and the vapor may flow into the plurality of condensing fins, where the vapor is cooled through heat exchange with the ambient environment. The cooling of the vapor may condense the evaporated liquid phase change material back into its liquid state, and the liquid phase change material may drip, under the force of gravity, back into the at least one internal chamber for reuse, thereby aiding in cooling the heat source.

These and other features of the present disclosure will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
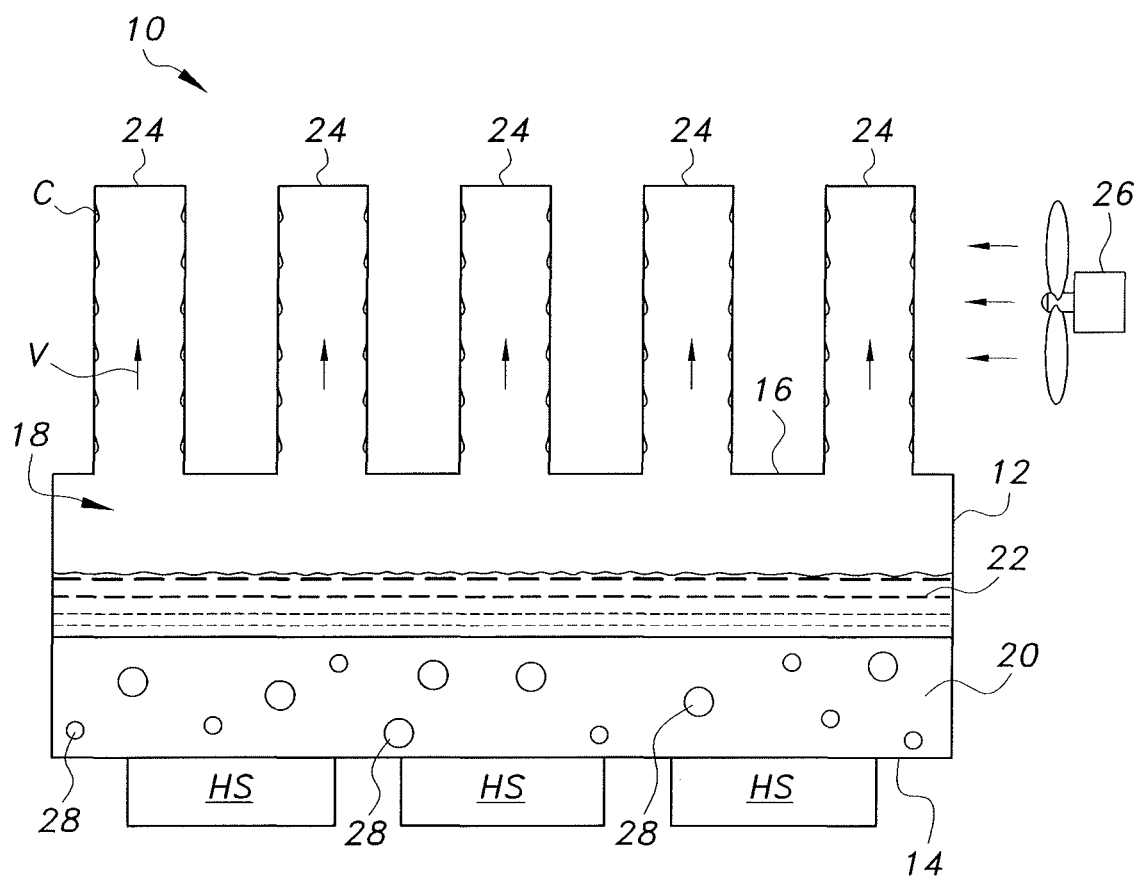
FIG. 1 is a side view in section of a heat sink with condensing fins and phase change material having a thermally conductive housing, a body of high thermal conductivity medium, and a body of liquid phase change material, wherein the thermally conductive housing is adapted to form at least one condensing fin.

As used herein, the term "open fluid communication" may refer to allowing the movement of any fluid between two spaces, including the movement of liquids, gasses, and the like.

In an embodiment, the present subject matter is directed to a heat sink with condensing fins and at least one phase change material. In an embodiment, the heat sink is formed from a thermally conductive housing, the thermally conductive housing having a first wall and an opposed second wall and the thermally conductive housing forming an internal chamber. The first wall of the thermally conductive housing is adapted to be in direct contact with one or more heat sources. A body of liquid phase change material is disposed within the internal chamber. The second wall of the thermally conductive housing is adapted to form a plurality of condensing fins.

In use, heat generated by the heat source is transferred, via conduction, through the thermally conductive housing and into the body of liquid phase change material. The heat may cause at least a portion of the body of liquid phase change material to evaporate, and the vapor may flow into the plurality of condensing fins, where the vapor is cooled through heat exchange with the ambient environment. The cooling of the vapor may condense the evaporated liquid phase change material back into its liquid state, and the liquid phase change material may drip, under the force of gravity, back into the at least one internal chamber for reuse, thereby aiding in cooling the heat source.

It should be understood that the heat source HS may be any component that requires cooling. In some embodiments, the component that requires cooling can be a processor chip, an integrated circuit chip, a modular circuit package, a photovoltaic cell, a light emitting diode or the like. In other embodiments, the heat sink with condensing fins and phase change material can provide cooling and/or energy transfer, such as when used in power generation, in space-faring vessels, or solar energy applications, and the like.

In some embodiments, a high thermal conductivity medium may be disposed within the internal chamber formed by the thermally conductive housing. The high thermal conductivity medium may be disposed in direct contact with the first wall of the thermally conductive housing, opposite the heat source, on one side and in direct contact with the body of liquid phase change material on the other side.

The material for use in the high thermal conductivity medium may be a phase change material. If the material for use in the high thermal conductivity medium is not a phase change material, a suitable material may be selected with a particularly high thermal conductivity, such as copper, aluminum, or the like. If the material for use in the high thermal conductivity medium is a phase change material, the phase change material is selected such that it has a melting temperature between the operating temperature of the heat sink and the boiling temperature of the at least one liquid phase change material. Multiple phase change materials having different melting points within the desired range of operation may be mixed in the high thermal conductivity medium in order to smooth the temperature range of phase change under varying ambient conditions. Non-limiting examples of solid phase change materials suitable for use in the high thermal conductivity medium include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

Where the high thermal conductivity medium is a phase change material, the high thermal conductivity medium may in use be entirely in a solid state, partially in a liquid state, or entirely in a liquid state. When the high thermal conductivity medium is entirely in a liquid state, it may remain entirely in a liquid state throughout operation of the heat sink with condensing fins and phase change material. When the high thermal conductivity medium is partially in a liquid state or entirely in a liquid state, the high thermal conductivity medium will enhance heat transfer into the body of liquid phase change material by conduction and convection. Further, where the high thermal conductivity medium is partially in a liquid state, the evaporation of the body of liquid phase change material will restrict further melting of the remaining solid state high thermal conductivity medium. When the high thermal conductivity medium reaches temperatures approaching the boiling temperature of the body of liquid phase change material, the body of liquid phase change material will start constantly evaporating, thereby restricting the high thermal conductivity medium from further melting and/or increasing in temperature. It should be understood that in use, the high thermal conductivity material may also remain entirely in a liquid state, or entirely in a solid state, during operation of the heat sink with condensing fins and at least one phase change material.

In some embodiments, the high thermal conductivity medium and/or the body of liquid phase change material may at least partially permeate a thermally conductive component. The thermally conductive component may be any suitable thermally conductive component, such as a thermally conductive foam, matrix, grid, mesh, or the like. The thermally conductive component may be selected to optimize heat transfer to the high thermal conductivity medium, thereby increasing the rate of heat removal from the heat source HS. The thermally conductive component may be particularly useful in applications where the selected high thermal conductivity medium has a lower thermal conductivity. The thermally conductive component may be particularly well suited for applications where the high thermal conductivity medium and/or the body of liquid phase change material permeating the thermally conductive component are in a partially liquid state or in an entirely liquid state.

The material selected for the thermally conductive housing may be any material with suitably high thermal conductivity and that is compatible with the body of liquid phase change material and the high thermal conductivity medium. For example, if the high thermal conductivity medium is gallium, aluminum would not be used to form the thermally conductive housing.

In some embodiments, at least one high thermal conductivity rod having a first end and an opposed second end is disposed within the internal chamber. The first end of each of the at least one high thermal conductivity rod may be disposed in the high thermal conductivity medium. The second end of each of the at least one high thermal conductivity rods may extend into one of the plurality of condensing fins. The material selected for the at least one high thermal conductivity rod may be any material with suitably high thermal conductivity and that is compatible with the body of liquid phase change material and the high thermal conductivity medium. The at least one high thermal conductivity rod provides an additional path for heat removal from the heat source. This feature is particularly helpful to avoid exhaustion of the body of liquid phase change material resulting in failure of the heat sink, and potentially in damage to the heat source. That is to say, where the rate of condensation is not sufficient to replenish the liquid phase change material, the at least one high thermal conductivity rod will continue to provide heat removal from the heat source.

In the embodiment of FIG. 1, the heat sink with condensing fins and phase change material, designated generally as 10, is formed from a thermally conductive housing 12, the thermally conductive housing 12 having a first wall 14 and an opposed second wall 16 and the thermally conductive housing forming an internal chamber 18. The first wall 14 of the thermally conductive housing 12 is adapted to be in direct contact with one or more heat sources HS. As shown in FIG. 1, three heat sources HS are present; however, it should be understood that any number of heat sources HS may be used. A high thermal conductivity medium 20 is disposed within the internal chamber 18, in direct contact with the first wall 14 of the thermally conductive housing 12 and opposite the one or more heat sources HS. A body of liquid phase change material 22 is disposed within the internal chamber 18, between the high thermal conductivity medium 20 and the second wall 16 of the thermally conductive housing 12. In some embodiments, the level of the body of liquid phase change material 22 will be lower than the second wall 16 of the thermally conductive housing 12, and thus will not contact the second wall 16 of the thermally conductive housing 12. The second wall 16 of the thermally conductive housing 12 is adapted to form a plurality of condensing fins 24. In some embodiments, the exterior wall of the plurality of condensing fins 24 may be in direct contact with any type of external cooling fin generally known in the art (not shown). It should be understood that the overall configuration and relative dimensions of the thermally conductive housing 12, the high thermal conductivity medium 20, the body of liquid phase change material 22, and the plurality of condensing fins 24 are shown for purposes of illustration only.

In use, heat generated by the heat source HS is transferred, via conduction, through the thermally conductive housing 12 and into the high thermal conductivity medium 20. In addition to the heat transferred into the high thermal conductivity medium 20, heat can further be transferred from the high thermal conductivity medium 20 into the body of liquid phase change material 22. The heat may cause at least a portion of the body of liquid phase change material 22 to evaporate, and the vapor V may flow into the plurality of condensing fins 24, where the vapor V is cooled through heat exchange with the ambient environment. The rate of cooling may be enhanced by one or more fans 26 blowing air across the condensing fins 24. The cooling of the vapor V may condense the evaporated liquid phase change material into a condensate C, and the condensate C may drip, under the force of gravity, back into the at least one internal chamber 18 for reuse, thereby aiding in cooling the heat source HS.

The presence of the high thermal conductivity medium 20 may be particularly useful to prevent heat flux conditions at the first wall 14 from causing a vapor film to cover the first wall 14, which could in turn lead to damage to the heat source HS. The high thermal conductivity medium 20, when combined with the body of liquid phase change material 22, may enhance heat removal, thereby preventing heat flux conditions from causing potential damage to the heat source HS.

The phase change material comprising the body of liquid phase change material 22 is selected such that after forming a vapor V by exposure to heat from the heat source HS, the vapor V will condense back into a condensate C when exposed, through the plurality of condensing fins 24, to the conditions of the ambient environment within which the heat sink will be operating. The selection of the phase change material comprising the body of liquid phase change material 22 may depend upon a number of conditions, including anticipated pressure in the internal chamber 18 and the external temperature during operation, and the surface area of each of the plurality of condensing fins 24. Under otherwise standard conditions, such as atmospheric temperature, the phase change material comprising the body of liquid phase change material 22 will have a boiling point slightly above the temperature of the ambient environment. By way of non-limiting example, where the plurality of condensing fins 24 has a larger surface area, the phase change material comprising the body of liquid phase change material 22 may be selected to have a boiling point 1° to 5° C. above the temperature of the ambient environment. By way of non-limiting example, where the plurality of condensing fins 24 has a smaller surface area, the phase change material comprising the body of liquid phase change material 22 may be selected to have a boiling point 5° to 10° C. above the temperature of the ambient environment.

Generally, the anticipated atmospheric temperature and the surface area of the plurality of condensing fins 24 will be the primary criteria used to select an appropriate phase change material for use in the body of liquid phase change material 22. Multiple phase change materials having different boiling points within the desired range of operation may be mixed in the body of liquid phase change material 22 in order to smooth the temperature range of phase change under varying ambient conditions. The pressure of the internal chamber 18 may also be adjusted to optimize the boiling point of the selected liquid phase change material for a particular intended use.

Non-limiting examples of liquid phase change materials suitable for use in the body of liquid phase change material 22 include one or more of water, formic acid, caprylic acid, glycerin, acetic acid, polyethylene glycol 600, n-hexadecane and n-heptadecane.

The material for use in the high thermal conductivity medium 20 may be a phase change material. If the material for use in the high thermal conductivity medium 20 is not a phase change material, a suitable material may be selected with a particularly high thermal conductivity, such as copper, aluminum, or the like. If the material for use in the high thermal conductivity medium 20 is a phase change material, the phase change material is selected such that it has a melting temperature between the operating temperature of the heat sink 10 and the boiling temperature of the at least one liquid phase change material 22. Multiple phase change materials having different melting points within the desired range of operation may be mixed in the high thermal conductivity medium 20 in order to smooth the temperature range of phase change under varying ambient conditions. Non-limiting examples of solid phase change materials suitable for use in the high thermal conductivity medium 20 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 20, the heat from the heat source HS may also cause at least a portion of the high thermal conductivity medium 20 to melt. The high thermal conductivity medium 20 will thus absorb and store additional heat until it can be transferred to the body of liquid phase change material 18, cooling the melted portion of the high thermal conductivity medium 20 and allowing it to freeze. It should be understood that in use the high thermal conductivity medium 20 may be in a solid state, a partially melted state, or a liquid state.

It should be further understood that in use the body of liquid phase change material 22 may be in a liquid state, a partially gaseous state, or a gaseous state.

In an alternative embodiment also illustrated in FIG. 1, the heat sink with condensing fins and phase change material 10 may include at least one encapsulated phase change material 28 disposed within the high thermal conductivity medium 20. The at least one encapsulated phase change material 28 may be a liquid phase change material or a solid phase change material. The materials selected to encapsulate the at least one encapsulated phase change material 28 may be chosen to expand in size when subjected to increased internal pressure and/or increased temperature and to contract in size when subjected to reduced internal pressure and/or decreased temperature. The at least one encapsulated phase change material 28 may include nano, micro, or meso sized particles, or a combination thereof. The use of varying materials or varying sizes of the at least one encapsulated phase change material 28 may prevent clustering of the at least one encapsulated phase change material 28 particles. The concentration of the at least one encapsulated phase change material 28 particles may be varied to optimize performance.

In use, the at least one encapsulated phase change material will absorb and store heat from the high thermal conductivity medium 20. The at least one encapsulated phase change material 28 will be particularly useful where the high thermal conductivity medium 20 is either partially or entirely melted. The at least one encapsulated phase change material 28 will initially be sufficiently dense to remain near the bottom of the high thermal conductivity medium 20. Should the high thermal conductivity medium 20 remain in the solid state, the at least one encapsulated phase change material 28 will remain as is. However, as the high thermal conductivity medium 20 melts and transitions to a liquid state, this will permit the at least one encapsulated phase change material 28 to heat up and change phase. This can cause the material encapsulating the at least one encapsulated phase change material 28 to be subjected to increased internal pressure and increased heat, and thus begin to expand. As the material encapsulating the at least one encapsulated phase change material 28 expands, it's buoyancy force will increase and the at least one encapsulated phase change material 28 will begin to rise through the melted high thermal conductivity medium 20, until the at least one encapsulated phase change material 28 encounters a cooler region of high thermal conductivity medium 20 and begins to cool/shrink, causing the at least one encapsulated phase change material 28 to eventually sink back to the lower portion of the high thermal conductivity medium 20. The at least one encapsulated phase change material 28 may also rise into the body of liquid phase change material 22, before cooling and shrinking in size sufficiently to return to the lower portion of the high thermal conductivity medium 20. This process increases the rate of heat transfer from the portion of the high thermal conductivity medium 20 near the heat source HS to the portion of the high thermal conductivity medium 20 near the body of liquid phase change material 22, partially due to agitation and mixing of the high thermal conductivity medium 20.

The materials selected to encapsulate the at least one encapsulated phase change material 28 may further be selected to optimize ascending and descending behavior of the at least one encapsulated phase change material 28 under specific targeted operating conditions (such as anticipated temperature of the high thermal conductivity medium 20 while operating). The size and kind of phase change material used for the at least one encapsulated phase change material 28 may vary, thus varying the temperature and/or the amount of heat captured or given off by the at least one encapsulated phase change material 28 required to cause the at least one encapsulated phase change material 28 to ascend or descend, and thereby maximizing the level of mixing and agitation of the high thermal conductivity medium 20 and of the interface between the high thermal conductivity medium 20 and the body of liquid phase change material 22. This dynamic agitation will assist in ensuring that the at least one encapsulated phase change material 28 does not aggregate at the interface of the high thermal conductivity medium 20 and the body of liquid phase change material 22.

If present, the phase change material used in the at least one encapsulated phase change material 28 is selected such that it has a phase change temperature between the highest boiling temperature of the phase change materials used in the body of liquid phase change material 22 and the highest melting temperature of phase change materials used in the high thermal conductivity medium 20. Non-limiting examples of liquid phase change materials useful as encapsulated phase change materials 28 include one or more of water, formic acid, caprylic acid, glycerin, acetic acid, polyethylene glycol 600, n-hexadecane and n-heptadecane. Non-limiting examples of solid phase change materials useful as encapsulated phase change materials 28 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

In another alternative embodiment illustrated in FIG. 1, the heat sink with condensing fins and phase change material 10 may include at least one encapsulated phase change material 28 disposed within the high thermal conductivity medium 20. The at least one encapsulated phase change material 28 may be a liquid phase change material or a solid phase change material. The heat sink with condensing fins and phase change material 10 may be adapted to produce a magnetic field, which may be modulated to raise or lower the at least one encapsulated phase change material 28 particles. The at least one encapsulated phase change material 28 may include nano, micro, or meso sized particles, or a combination thereof. The use of varying materials or varying sizes of the at least one encapsulated phase change material 28 may prevent clustering of the at least one encapsulated phase change material 28 particles.

In use, the at least one encapsulated phase change material will absorb and store heat from the high thermal conductivity medium 20. The at least one encapsulated phase change material 28 will be particularly useful where the high thermal conductivity medium 20 is either partially or entirely melted. The at least one encapsulated phase change material 28 will initially be sufficiently dense to remain near the bottom of the high thermal conductivity medium 20. The magnetic field may be periodically activated and deactivated or reversed. The activation of the magnetic field may draw the at least one encapsulated phase change material 28 through the high thermal conductivity medium 20 towards cooler layers of the high thermal conductivity medium 20 and/or the body of liquid phase change material 22, thereby cooling the at least one encapsulated phase change material. The deactivation or reversal of the magnetic field may allow the at least one encapsulated phase change material 28 to settle back (or actively be repelled back) into the hotter layers of the high thermal conductivity medium 20.

Figure 2A:
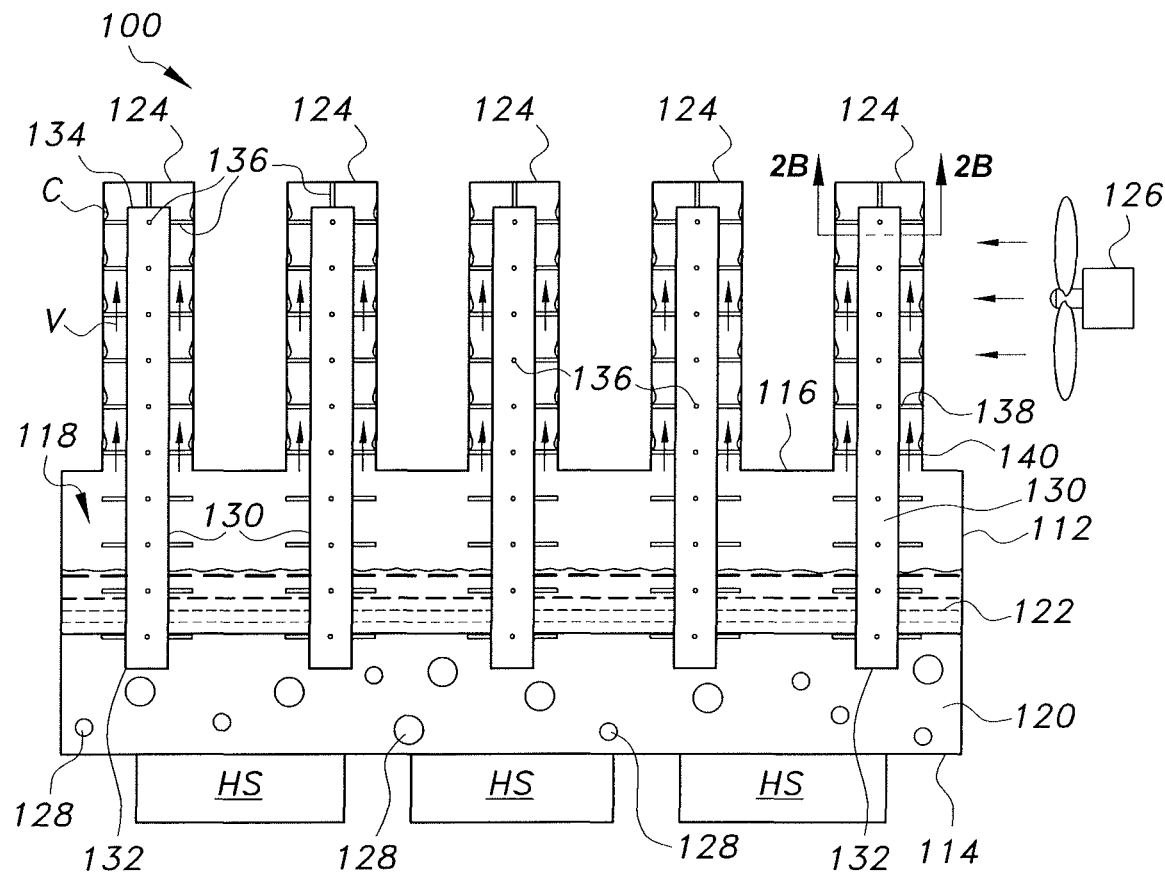
FIG. 2A is a side view in section of a heat sink with condensing fins and phase change material including at least one high thermal conductivity rod and a plurality of side beams.
Figure 2B:
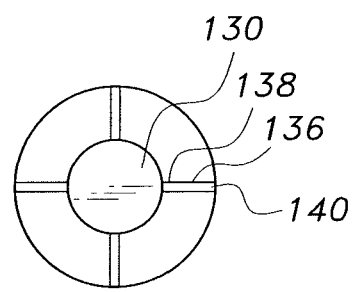
FIG. 2B is a section view drawn along line 2B of FIG. 2A illustrating a condensing fin, high thermal conductivity rod, and side beams.

In the alternative embodiment of FIGS. 2A and 2B, the heat sink with condensing fins and phase change material, designated generally as 100, is formed from a thermally conductive housing 112, the thermally conductive housing 112 having a first wall 114 and an opposed second wall 116 and the thermally conductive housing forming an internal chamber 118. The first wall 114 of the thermally conductive housing 112 is adapted to be in direct contact with one or more heat sources HS. As shown in FIG. 2A, three heat sources HS are present; however, it should be understood that any number of heat sources HS may be used. A high thermal conductivity medium 120 is disposed within the internal chamber 118, in direct contact with the first wall 114 of the thermally conductive housing 112 and opposite the one or more heat sources HS. A body of liquid phase change material 122 is disposed within the internal chamber 118, between the high thermal conductivity medium 120 and the second wall 116 of the thermally conductive housing 112. In some embodiments, the level of the body of liquid phase change material 122 will be lower than the second wall 116 of the thermally conductive housing 112, and thus will not contact the second wall 116 of the thermally conductive housing 112. The second wall 116 of the thermally conductive housing 112 is adapted to form a plurality of condensing fins 124. In some embodiments, the exterior wall of the plurality of condensing fins 124 may be in direct contact with any type of external cooling fin generally known in the art (not shown). It should be understood that the overall configuration and relative dimensions of the thermally conductive housing 112, the high-thermal conductivity medium 120, the body of liquid phase change material 122, and the plurality of condensing fins 124 are shown for purposes of illustration only.

In the alternative embodiment of FIGS. 2A and 2B, at least one high thermal conductivity rod 130 having a first end 132 and an opposed second end 134 is disposed within the internal chamber 118. The first end 132 of each of the at least one high thermal conductivity rods 130 is disposed in the high thermal conductivity medium 120. The second end 134 of each of the at least one high thermal conductivity rods 130 extends into one of the plurality of condensing fins 124.

In the alternative embodiment of FIGS. 2A and 2B, a plurality of side beams 136, having a first end 138 and an opposed second end 140, connect each of the at least one high thermal conductivity rods 130 to the second wall 116 of the thermally conductive housing. The first end 138 of each of the plurality of side beams 136 is attached to one of the at least one high thermal conductivity rods 130 and the second end 140 of each of the plurality of side beams 136 may be attached to the second wall 116 of the thermally conductive housing or may extend into the high thermal conductivity medium 120 or the body of liquid phase change material 122. The plurality of side beams 136 may be made of any high thermal conductivity material suitable for conducting heat.

In use, heat generated by the heat source HS is transferred, via conduction, through the thermally conductive housing 112 and into the high thermal conductivity medium 120. In addition to the heat transferred into the high thermal conductivity medium 120, heat can further be transferred from the high thermal conductivity medium 120 into the body of liquid phase change material 122. The heat may cause at least a portion of the body of liquid phase change material 122 to evaporate, and the vapor V may flow into the plurality of condensing fins 124, where the vapor V is cooled through heat exchange with the ambient environment. The rate of cooling may be enhanced by one or more fans 126 blowing air across the condensing fins 124. The cooling of the vapor V may condense the evaporated liquid phase change material into a condensate C, and the condensate C may drip, under the force of gravity, back into the at least one internal chamber 118 for reuse, thereby aiding in cooling the heat source HS.

The presence of the high thermal conductivity medium 120 may be particularly useful to prevent heat flux conditions at the first wall 114 from causing a vapor film to cover the first wall 114, which could in turn lead to damage to the heat source HS. The high thermal conductivity medium 120, when combined with the body of liquid phase change material 122, may enhance heat removal, thereby preventing heat flux conditions from causing potential damage to the heat source HS.

In the alternative embodiment of FIGS. 2A and 2B, heat may also be transferred by conduction from the high thermal conductivity medium 120, or the body of liquid phase change material 122, into the at least one high thermal conductivity rod 130, and from the at least one high thermal conductivity rod 130, into the body of liquid phase change material 122 and/or through the plurality of side beams 136, and into the second wall of the thermally conductive housing, thereby providing accelerated cooling of the heat source HS through additional heat exchange with the ambient environment.

The phase change material comprising the body of liquid phase change material 122 is selected such that after forming a vapor V by exposure to heat from the heat source HS, the vapor V will condense back into a condensate C when exposed, through the plurality of condensing fins 124, to the conditions of the ambient environment within which the heat sink will be operating. The selection of the phase change material comprising the body of liquid phase change material 122 may depend upon a number of conditions, including anticipated pressure in the internal chamber 118, the external temperature during operation, and the surface area of each of the plurality of condensing fins 124. Under otherwise standard conditions, such as atmospheric temperature, the phase change material comprising the body of liquid phase change material 122 will have a boiling point slightly above the temperature of the ambient environment. By way of non-limiting example, where the plurality of condensing fins 124 has a larger surface area, the phase change material comprising the body of liquid phase change material 122 may be selected to have a boiling point 1° to 5° C. above the temperature of the ambient environment. By way of non-limiting example, where the plurality of condensing fins 124 has a smaller surface area, the phase change material comprising the body of liquid phase change material 122 may be selected to have a boiling point 5° to 10° C. above the temperature of the ambient environment.

Generally, the anticipated atmospheric temperature and the surface area of the plurality of condensing fins 124 will be the primary criteria used to select an appropriate phase change material for use in the body of liquid phase change material 122. Multiple phase change materials having different boiling points within the desired range of operation may be mixed in the body of liquid phase change material 122 in order to smooth the temperature range of phase change under varying ambient conditions. The pressure of the internal chamber 118 may also be adjusted to optimize the boiling point of the selected liquid phase change material for a particular intended use.

Non-limiting examples of liquid phase change materials suitable for use in the body of liquid phase change material 122 include one or more of water, formic acid, caprylic acid, glycerin, acetic acid, polyethylene glycol 600, n-hexadecane and n-heptadecane.

The material for use in the high thermal conductivity medium 120 may be a phase change material. If the material for use in the high thermal conductivity medium 120 is not a phase change material, a suitable material may be selected with a particularly high thermal conductivity, such as copper, aluminum, or the like. If the material for use in the high thermal conductivity medium 120 is a phase change material, the phase change material for use in the high thermal conductivity medium 120 is selected such that it has a melting temperature between the operating temperature of the heat sink 100 and the boiling temperature of the at least one liquid phase change material 122. Multiple phase change materials having different melting points within the desired range of operation may be mixed in the high thermal conductivity medium 120 in order to smooth the temperature range of phase change under varying ambient conditions. Non-limiting examples of solid phase change materials suitable for use in the high thermal conductivity medium 120 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 120, the heat from the heat source HS may also cause at least a portion of the high thermal conductivity medium 120 to melt. The high thermal conductivity medium 120 will thus absorb and store additional heat until it can be transferred to the body of liquid phase change material 122, cooling the melted portion of the high thermal conductivity medium 120 and allowing it to freeze. It should be understood that in use the high thermal conductivity medium 120 may be in a solid state, a partially melted state, or a liquid state.

It should be further understood that in use the body of liquid phase change material 122 may be in a liquid state, a partially gaseous state, or a gaseous state.

In an alternative embodiment also illustrated in FIG. 2A, the heat sink with condensing fins and phase change material 100 may include at least one encapsulated phase change material 128 disposed within the high thermal conductivity medium 120. The at least one encapsulated phase change material 128 may be a liquid phase change material or a solid phase change material. The materials selected to encapsulate the at least one encapsulated phase change material 128 may be chosen to expand in size when subjected to increased internal pressure and/or increased temperature and to contract in size when subjected to reduced internal pressure and/or decreased temperature. The at least one encapsulated phase change material 128 may include nano, micro, or meso sized particles, or a combination thereof. The use of varying materials or varying sizes of the at least one encapsulated phase change material 128 may prevent clustering of the at least one encapsulated phase change material 128 particles. The concentration of the at least one encapsulated phase change material 128 particles may be varied to optimize performance.

In use, the at least one encapsulated phase change material will absorb and store heat from the high thermal conductivity medium 120. The at least one encapsulated phase change material 128 will be particularly useful where the high thermal conductivity medium 120 is either partially or entirely melted. The at least one encapsulated phase change material 128 will initially be sufficiently dense to remain near the bottom of the high thermal conductivity medium 120. Should the high thermal conductivity medium 120 remain in the solid state, the at least one encapsulated phase change material 128 will remain as is. However, as the high thermal conductivity medium 120 melts and transitions to a liquid state, this will permit the at least one encapsulated phase change material 128 to heat up and change phase. This can cause the material encapsulating the at least one encapsulated phase change material 218 to be subjected to increased internal pressure and increased heat, and thus begin to expand. As the material encapsulating the at least one encapsulated phase change material 128 expands, it's buoyancy force will increase and the at least one encapsulated phase change material 128 will begin to rise through the melted high thermal conductivity medium 120, until the at least one encapsulated phase change material 128 encounters a cooler region of high thermal conductivity medium 120 and begins to cool/shrink, causing the at least one encapsulated phase change material 128 to eventually sink back to the lower portion of the high thermal conductivity medium 120. The at least one encapsulated phase change material 2=128 may also rise into the body of liquid phase change material 122, before cooling and shrinking in size sufficiently to return to the lower portion of the high thermal conductivity medium 2=120. This process increases the rate of heat transfer from the portion of the high thermal conductivity medium 120 near the heat source HS to the portion of the high thermal conductivity medium 120 near the body of liquid phase change material 122, partially due to agitation and mixing of the high thermal conductivity medium 120. Clustering of the encapsulated phase change materials could form a barrier, resulting in an undesirable reduction in heat transfer. As discussed above, varying materials or varying sizes of the at least one encapsulated phase change material 128 may be selected to prevent clustering of the at least one encapsulated phase change material 128 particles (as the individual encapsulated phase change materials 128 will have different buoyancies, and thus will rise and fall at different temperatures).

The materials selected to encapsulate the at least one encapsulated phase change material 128 may further be selected to optimize ascending and descending behavior of the at least one encapsulated phase change material 128 under specific targeted operating conditions (such as anticipated temperature of the high thermal conductivity medium 120 while operating). The size and kind of phase change material used for the at least one encapsulated phase change material 128 may vary, thus varying the temperature and/or the amount of heat captured or given off by the at least one encapsulated phase change material 128 required to cause the at least one encapsulated phase change material 128 to ascend or descend, and thereby maximizing the level of mixing and agitation of the high thermal conductivity medium 120 and of the interface between the high thermal conductivity medium 120 and the body of liquid phase change material 122. This dynamic agitation will assist in ensuring that the at least one encapsulated phase change material 128 does not aggregate at the interface of the high thermal conductivity medium 120 and the body of liquid phase change material 122.

If present, the phase change material used in the at least one encapsulated phase change material 128 is selected such that it has a phase change temperature between the highest boiling temperature of the phase change materials used in the body of liquid phase change material 122 and the highest melting temperature of phase change materials used in the high thermal conductivity medium 120. Non-limiting examples of liquid phase change materials useful as encapsulated phase change materials 128 include one or more of water, formic acid, caprylic acid, glycerin, acetic acid, polyethylene glycol 600, n-hexadecane and n-heptadecane. Non-limiting examples of solid phase change materials useful as encapsulated phase change materials 128 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

Figure 3:
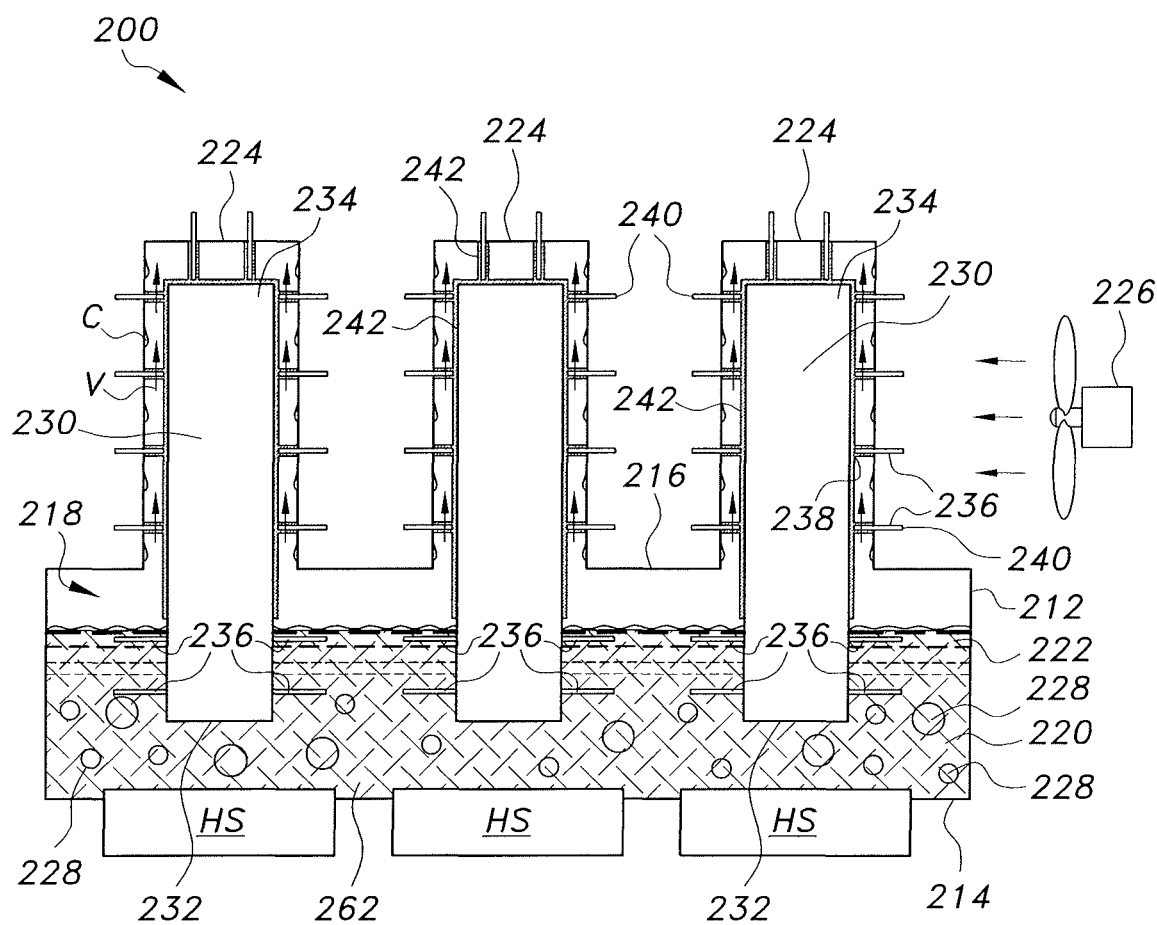
FIG. 3 is a side view in section of a heat sink with condensing fins and phase change material including at least one high thermal conductivity rod and a plurality of side beams, wherein at least some of the plurality of side beams extend through the thermally conductive housing and the outer surface of the high thermal conductivity rod and the outer surface of at least some of the side beams are partially lined with an insulating material.

In the alternative embodiment of FIG. 3, the heat sink with condensing fins and phase change material, designated generally as 200, is formed from a thermally conductive housing 212, the thermally conductive housing 212 having a first wall 214 and an opposed second wall 216 and the thermally conductive housing forming an internal chamber 218. The first wall 214 of the thermally conductive housing 212 is adapted to be in direct contact with one or more heat sources HS. As shown in FIG. 3, three heat sources HS are present; however, it should be understood that any number of heat sources HS may be used. A high thermal conductivity medium 220 is disposed within the internal chamber 218, in direct contact with the first wall 214 of the thermally conductive housing 212 and opposite the one or more heat sources HS. A body of liquid phase change material 222 is disposed within the internal chamber 318, between the high thermal conductivity medium 220 and the second wall 216 of the thermally conductive housing 212.

In some embodiments, the level of the body of liquid phase change material 222 will be lower than the second wall 216 of the thermally conductive housing 212, and thus will not contact the second wall 216 of the thermally conductive housing 212. The second wall 216 of the thermally conductive housing 212 is adapted to form a plurality of condensing fins 224. In some embodiments, the exterior wall of the plurality of condensing fins 224 may be in direct contact with any type of external cooling fin generally known in the art (not shown). It should be understood that the overall configuration and relative dimensions of the thermally conductive housing 212, the high thermal conductivity medium 220, the body of liquid phase change material 222, and the plurality of condensing fins 224 are shown for purposes of illustration only.

As in the previous embodiment, at least one high thermal conductivity rod 230 having a first end 232 and an opposed second end 234 is disposed within the internal chamber 218. The first end 232 of each of the at least one high thermal conductivity rods 230 is disposed in the high thermal conductivity medium 220. The second end 234 of each of the at least one high thermal conductivity rods 230 extends into one of the plurality of condensing fins 224.

As in the previous embodiment, a plurality of side beams 236, having a first end 238 and an opposed second end 240, connect each of the at least one high thermal conductivity rods 230 to the second wall 216 of the thermally conductive housing. The first end 238 of each of the plurality of side beams 236 is attached to one of the at least one high thermal conductivity rods 230. The plurality of side beams 236 may be made of any high thermal conductivity material suitable for conducting heat.

In the alternative embodiment of FIG. 3, at least some of the plurality of side beams 236 extends through the second wall 216 of the thermally conductive housing 212 and the second end 240 of at least some of the plurality of side beams 236 is outside the thermally conductive housing 212. The second end 240 of the rest of the plurality of side beams 236 may extend into the high thermal conductivity medium 220 or the body of liquid phase change material 222. In another embodiment, some of the plurality of side beams may contact the second wall, as per FIG. 2A, while others of the plurality of side beams may extend through the second wall, as per FIG. 3.

In an alternative embodiment illustrated in FIG. 3, an insulating material 242 may line some, or all of the portion of the outer surface of at least one of the at least one high thermal conductivity rods 230 that is outside the high thermal conductivity medium 220 and the body of liquid phase change material 222. The insulating material 242 may be a ceramic coating, a thin film coating such as a nanomaterial, or the like. The insulating material 242 may also line none, some, or all, of the portion of the outer surface of the plurality of side beams 236 that is within the thermally conductive housing 212. In an embodiment, the insulating material 242 may line the outside of some of the at least one high thermal conductivity rods 230 and the plurality of side beams 236.

In the alternative embodiment of FIG. 3, the insulating material 242 reduces heat exchange between both the at least one high thermal conductivity rod 230 and the plurality of side beams 236 and the vapor V, which could interfere with the rate of condensation.

In the alternative embodiment of FIG. 3, the high thermal conductivity medium 220 and the body of liquid phase change material 22 are shown at least partially permeating a thermally conductive component 262. The thermally conductive component 262 may be any suitable thermally conductive component, such as a thermally conductive foam, matrix, grid, mesh, or the like. The thermally conductive component 262 may be selected to optimize heat transfer to the high thermal conductivity medium 220, thereby increasing the rate of heat removal from the heat source HS. The thermally conductive component 262 may be particularly useful in applications where the selected high thermal conductivity medium 220 has a lower thermal conductivity.

In use, heat generated by the heat source HS is transferred, via conduction, through the thermally conductive housing 212 and into the high thermal conductivity medium 220. In addition to the heat transferred into the high thermal conductivity medium 220, heat can further be transferred from the high thermal conductivity medium 220 into the body of liquid phase change material 222. The heat may cause at least a portion of the body of liquid phase change material 222 to evaporate, and the vapor V may flow into the plurality of condensing fins 224, where the vapor V is cooled through heat exchange with the ambient environment. The rate of cooling may be enhanced by one or more fans 226 blowing air across the condensing fins 224. The cooling of the vapor V may condense the evaporated liquid phase change material into a condensate C, and the condensate C may drip, under the force of gravity, back into the at least one internal chamber 218 for reuse, thereby aiding in cooling the heat source HS.

The presence of the high thermal conductivity medium 220 may be particularly useful to prevent heat flux conditions at the first wall 214 from causing a vapor film to cover the first wall 214, which could in turn lead to damage to the heat source HS. The high thermal conductivity medium 220, when combined with the body of liquid phase change material 222, may enhance heat removal, thereby preventing heat flux conditions from causing potential damage to the heat source HS.

As in the previous embodiment, heat may also be transferred by conduction from the high thermal conductivity medium 220, or the body of liquid phase change material 222, into the at least one high thermal conductivity rod 230, and from the at least one high thermal conductivity rod 230 into the body of liquid phase change material 222, and/or through the plurality of side beams 236, and into and through the second wall of the thermally conductive housing, thereby providing accelerated cooling of the heat source HS through additional heat exchange with the ambient environment.

The phase change material comprising the body of liquid phase change material 222 is selected such that after forming a vapor V by exposure to heat from the heat source HS, the vapor V will condense back into a condensate C when exposed, through the plurality of condensing fins 224, to the conditions of the ambient environment within which the heat sink will be operating. The selection of the phase change material comprising the body of liquid phase change material 222 may depend upon a number of conditions, including anticipated pressure in the internal chamber 218, the external temperature during operation, and the surface area of each of the plurality of condensing fins 224. Under otherwise standard conditions, such as atmospheric temperature, the phase change material comprising the body of liquid phase change material 222 will have a boiling point slightly above the temperature of the ambient environment. By way of non-limiting example, where the plurality of condensing fins 224 has a larger surface area, the phase change material comprising the body of liquid phase change material 222 may be selected to have a boiling point 1° to 5° C. above the temperature of the ambient environment. By way of non-limiting example, where the plurality of condensing fins 224 has a smaller surface area, the phase change material comprising the body of liquid phase change material 222 may be selected to have a boiling point 5° to 10° C. above the temperature of the ambient environment.

Generally, the anticipated atmospheric temperature and the surface area of the plurality of condensing fins 224 will be the primary criteria used to select an appropriate phase change material for use in the body of liquid phase change material 222. Multiple phase change materials having different boiling points within the desired range of operation may be mixed in the body of liquid phase change material 222 in order to smooth the temperature range of phase change under varying ambient conditions. The pressure of the internal chamber 218 may also be adjusted to optimize the boiling point of the selected liquid phase change material for a particular intended use.

Non-limiting examples of liquid phase change materials suitable for use in the body of liquid phase change material 222 include one or more of water, formic acid, caprylic acid, glycerin, acetic acid, polyethylene glycol 600, n-hexadecane and n-heptadecane.

The material for use in the high thermal conductivity medium 220 may be a phase change material. If the material for use in the high thermal conductivity medium 220 is not a phase change material, a suitable material may be selected with a particularly high thermal conductivity, such as copper, aluminum, or the like. If the material for use in the high thermal conductivity medium 220 is a phase change material, the phase change material for use in the high thermal conductivity medium 220 is selected such that it has a melting temperature between the operating temperature of the heat sink 200 and the boiling temperature of the at least one liquid phase change material 222. Multiple phase change materials having different melting points within the desired range of operation may be mixed in the high thermal conductivity medium 220 in order to smooth the temperature range of phase change under varying ambient conditions. Non-limiting examples of solid phase change materials suitable for use in the high thermal conductivity medium 220 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 220, the heat from the heat source HS may also cause at least a portion of the high thermal conductivity medium 220 to melt. The high thermal conductivity medium 220 will thus absorb and store additional heat until it can be transferred to the body of liquid phase change material 222, cooling the melted portion of the high thermal conductivity medium 220 and allowing it to freeze. It should be understood that in use the high thermal conductivity medium 220 may be in a solid state, a partially melted state, or a liquid state.

It should be further understood that in use the body of liquid phase change material 222 may be in a liquid state, a partially gaseous state, or a gaseous state.

As shown in the previous embodiment, the heat sink with condensing fins and phase change material 200 may include at least one encapsulated phase change material 228 disposed within the high thermal conductivity medium 220. The at least one encapsulated phase change material 228 may be a liquid phase change material or a solid phase change material. The materials selected to encapsulate the at least one encapsulated phase change material 228 may be chosen to expand in size when subjected to increased internal pressure and/or increased temperature and to contract in size when subjected to reduced internal pressure and/or decreased temperature. The at least one encapsulated phase change material 228 may include nano, micro, or meso sized particles, or a combination thereof. The use of varying materials or varying sizes of the at least one encapsulated phase change material 228 may prevent clustering of the at least one encapsulated phase change material 228 particles. If the thermally conductive component 262 and the at least one encapsulated phase change material 228 are both present in the same embodiment, the pore size of the thermally conductive component may be selected to allow the at least one encapsulated phase change material 228 to readily pass through the pores of the thermally conductive component 262. The concentration of the at least one encapsulated phase change material 228 particles may be varied to optimize performance.

In use, the at least one encapsulated phase change material 228 will absorb and store heat from the high thermal conductivity medium 220. The at least one encapsulated phase change material 228 will be particularly useful where the high thermal conductivity medium 220 is either partially or entirely melted. The at least one encapsulated phase change material 228 will initially be sufficiently dense to remain near the bottom of the high thermal conductivity medium 220. Should the high thermal conductivity medium 220 remain in the solid state, the at least one encapsulated phase change material 228 will remain as is. However, as the high thermal conductivity medium 220 melts and transitions to a liquid state, this will permit the at least one encapsulated phase change material 228 to heat up and change phase. This can cause the material encapsulating the at least one encapsulated phase change material 228 to be subjected to increased internal pressure and increased heat, and thus begin to expand. As the material encapsulating the at least one encapsulated phase change material 228 expands, it's buoyancy force will increase and the at least one encapsulated phase change material 228 will begin to rise through the melted high thermal conductivity medium 220, until the at least one encapsulated phase change material 228 encounters a cooler region of high thermal conductivity medium 220 and begins to cool/shrink, causing the at least one encapsulated phase change material 228 to eventually sink back to the lower portion of the high thermal conductivity medium 220. The at least one encapsulated phase change material 228 may also rise into the body of liquid phase change material 222, before cooling and shrinking in size sufficiently to return to the lower portion of the high thermal conductivity medium 220. This process increases the rate of heat transfer from the portion of the high thermal conductivity medium 220 near the heat source HS to the portion of the high thermal conductivity medium 220 near the body of liquid phase change material 222, partially due to agitation and mixing of the high thermal conductivity medium 220.

The materials selected to encapsulate the at least one encapsulated phase change material 228 may further be selected to optimize ascending and descending behavior of the at least one encapsulated phase change material 228 under specific targeted operating conditions (such as anticipated temperature of the high thermal conductivity medium 220 while operating). The size and kind of phase change material used for the at least one encapsulated phase change material 228 may vary, thus varying the temperature and/or the amount of heat captured or given off by the at least one encapsulated phase change material 228 required to cause the at least one encapsulated phase change material 228 to ascend or descend, and thereby maximizing the level of mixing and agitation of the high thermal conductivity medium 220 and of the interface between the high thermal conductivity medium 220 and the body of liquid phase change material 222. This dynamic agitation will assist in ensuring that the at least one encapsulated phase change material 228 does not aggregate at the interface of the high thermal conductivity medium 220 and the body of liquid phase change material 222.

If present, the phase change material used in the at least one encapsulated phase change material 228 is selected such that it has a phase change temperature between the highest boiling temperature of the phase change materials used in the body of liquid phase change material 222 and the highest melting temperature of phase change materials used in the high thermal conductivity medium 220. Non-limiting examples of liquid phase change materials useful as encapsulated phase change materials 228 include one or more of water, formic acid, caprylic acid, glycerin, acetic acid, polyethylene glycol 600, n-hexadecane and n-heptadecane. Non-limiting examples of solid phase change materials useful as encapsulated phase change materials 228 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

Figure 4A:
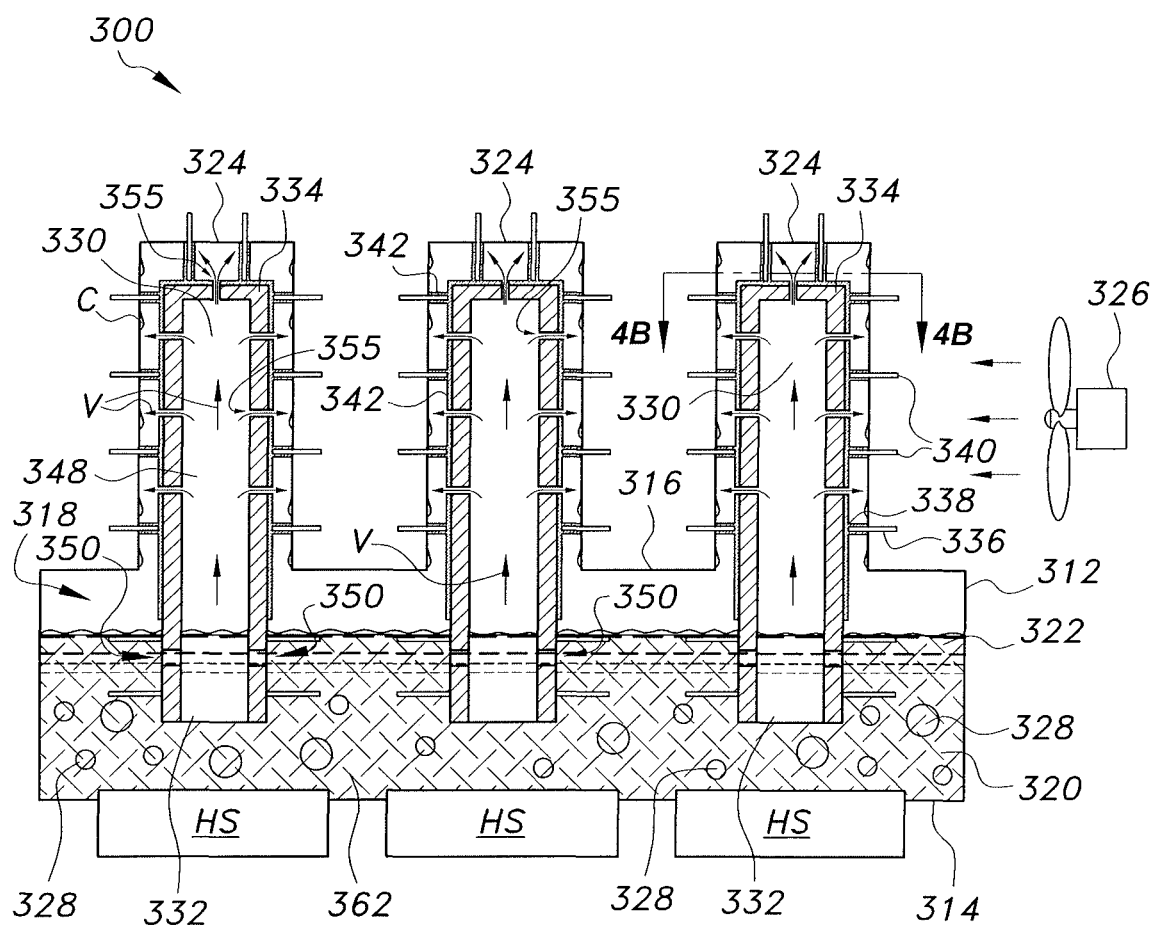
FIG. 4A is a side view in section of a heat sink with condensing fins and phase change material including at least one high thermal conductivity rod and a plurality of side beams, wherein the at least one high thermal conductivity rod has an internal chamber in open fluid communication with the body of liquid phase change material and has vapor jets allowing vapor to escape the inner chamber and contact the condensing fins.
Figure 4B:
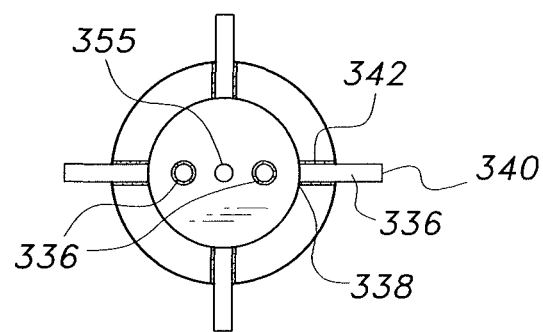
FIG. 4B is a section view drawn along line 4B of FIG. 4A illustrating a high thermal conductivity rod with side beams, wherein the high thermal conductivity rod has an internal chamber and the outer surface of the high thermal conductivity rod and the outer surface of at least some of the side beams are partially lined with an insulating material. There are vapor jets along the length of the high thermal conductivity rod and in the top of the high thermal conductivity rod, through which vapor can escape.

In the alternative embodiment of FIGS. 4A and 4B, the heat sink with condensing fins and phase change material, designated generally as 300, is formed from a thermally conductive housing 312, the thermally conductive housing 312 having a first wall 314 and an opposed second wall 316 and the thermally conductive housing forming an internal chamber 318. The first wall 314 of the thermally conductive housing 312 is adapted to be in direct contact with one or more heat sources HS. As shown in FIG. 4A, three heat sources HS are present; however, it should be understood that any number of heat sources HS may be used. A high thermal conductivity medium 320 is disposed within the internal chamber 318, in direct contact with the first wall 314 of the thermally conductive housing 312 and opposite the one or more heat sources HS. A body of liquid phase change material 322 is disposed within the internal chamber 318, between the high thermal conductivity medium 320 and the second wall 316 of the thermally conductive housing 312. In some embodiments, the level of the body of liquid phase change material 322 will be lower than the second wall 316 of the thermally conductive housing 312, and thus will not contact the second wall 316 of the thermally conductive housing 312. The second wall 316 of the thermally conductive housing 312 is adapted to form a plurality of condensing fins 324. In some embodiments, the exterior wall of the plurality of condensing fins 324 may be in direct contact with any type of external cooling fin generally known in the art (not shown). It should be understood that the overall configuration and relative dimensions of the thermally conductive housing 312, the high thermal conductivity medium 320, the body of liquid phase change material 322, and the plurality of condensing fins 324 are shown for purposes of illustration only.

As in the previous embodiment, at least one high thermal conductivity rod 330 having a first end 332 and an opposed second end 334 is disposed within the internal chamber 318. The first end 332 of each of the at least one high thermal conductivity rods 330 is disposed in the high thermal conductivity medium 320. The second end 334 of each of the at least one high thermal conductivity rods 330 extends into one of the plurality of condensing fins 324.

As in the previous embodiment, a plurality of side beams 336, having a first end 338 and an opposed second end 340, connect each of the at least one high thermal conductivity rods 330 to the second wall 316 of the thermally conductive housing. The first end 338 of each of the plurality of side beams 336 is attached to one of the at least one high thermal conductivity rods 330. At least some of the plurality of side beams 336 extends through the second wall 316 of the thermally conductive housing 312 and the second end 340 of each of the plurality of side beams 336 is outside the thermally conductive housing 312. The second end 340 of the rest of the plurality of side beams 336 may extend into the high thermal conductivity medium 320 or the body of liquid phase change material 322. The plurality of side beams 336 may be made of any high thermal conductivity material suitable for conducting heat.

In the alternative embodiment of FIGS. 4A and 4B, each of the at least one high thermal conductivity rods 330 has an internal chamber 348 and at least one access point 350, located in the portion of each of the at least one high thermal conductivity rods 330 within the body of liquid phase change material 322, and placing the internal chamber 348 of each of the at least one high thermal conductivity rods 330 in open fluid communication with the body of liquid phase change material 322. Each of the at least one high thermal conductivity rods 330 also has at least one vapor jet 355, located in the portion of each of the at least one high thermal conductivity rods 330 within one of the plurality of condensing fins 324 and placing the internal chamber 348 of each of the at least one high thermal conductivity rods 330 in open fluid communication with the portion of the inside of one of the plurality of condensing fin 324.

As in the previous embodiment, an insulating material 342 may line some, or all of the portion of the outer surface of at least one of the at least one high thermal conductivity rods 330 that is outside the high thermal conductivity medium 320 and the body of liquid phase change material 322. The insulating material 342 may be a ceramic coating, a thin film coating such as a nanomaterial, or the like. The insulating material 342 may also line none, some, or all, of the portion of the outer surface of the plurality of side beams 336 that is within the thermally conductive housing 312.

As in the previous embodiment, the insulating material 342 reduces heat exchange between both the at least one high thermal conductivity rod 330 and the plurality of side beams 236 and the vapor V, which could interfere with the rate of condensation.

As in the previous embodiment, the high thermal conductivity medium 320 and the body of liquid phase change material 322 are shown at least partially permeating a thermally conductive component 362. The thermally conductive component 362 may be any suitable thermally conductive component, such as a thermally conductive foam, matrix, grid, mesh, or the like. The thermally conductive component 362 may be selected to optimize heat transfer to the high thermal conductivity medium 320, thereby increasing the rate of heat removal from the heat source HS. The thermally conductive component 362 may be particularly useful in applications where the selected high thermal conductivity medium 320 has a lower thermal conductivity.

In use, heat generated by the heat source HS is transferred, via conduction, through the thermally conductive housing 312 and into the high thermal conductivity medium 320. In addition to the heat transferred into the high thermal conductivity medium 320, heat can further be transferred from the high thermal conductivity medium 320 into the body of liquid phase change material 322. The heat may cause at least a portion of the body of liquid phase change material 322 to evaporate, and the vapor V may flow into the plurality of condensing fins 324, and into the internal chamber 348 of each of the at least one high thermal conductivity rods 330. The vapor V may be cooled through heat exchange with the ambient environment. The cooling of the vapor V may condense the evaporated liquid phase change material into a condensate C, and the condensate C may drip, under the force of gravity, back into and through the at least one internal chamber 318 for reuse, thereby aiding in cooling the heat source HS. The internal chamber 348 permits more vapor V to enter into each of the plurality of condensing fins 324. The vapor V within the internal chamber 348 of each of the at least one high thermal conductivity rods 330 will absorb further heat from each of the at least one high thermal conductivity rods 330, increasing the cooling rate of each of the at least one high thermal conductivity rods 330 and further heating the vapor V within the internal chamber 348, and building pressure within the second end 334 of each of the at least one high thermal conductivity rods 330. This additional cooling of the at least one high thermal conductivity rods 330 will cause the at least one high thermal conductivity rods 330 to draw even more heat from the high thermal conductivity medium 320 and the heat source HS. The vapor jets 355 are small, nozzle like openings, allowing the vapor V in the internal chamber 348 to escape under high pressure, and thus causing the vapor V to impinge upon the second wall 316 of the thermally conductive housing 312, enhancing heat exchange with the ambient environment and increasing the rate of return of any condensate C present upon the second wall 316 of the thermally conductive housing 312 by flushing or physically removing and condensate C clinging to the second wall 316 of the thermally conductive housing 312. The rate of cooling may be enhanced by one or more fans 326 blowing air across the condensing fins 324.

The presence of the high thermal conductivity medium 320 may be particularly useful to prevent heat flux conditions at the first wall 314 from causing a vapor film to cover the first wall 314, which could in turn lead to damage to the heat source HS. The high thermal conductivity medium 320, when combined with the body of liquid phase change material 322, may enhance heat removal, thereby preventing heat flux conditions from causing potential damage to the heat source HS.

As in the previous embodiment, heat may also be transferred by conduction from the high thermal conductivity medium 320, or the body of liquid phase change material 322, into the at least one high thermal conductivity rod 330, and from the at least one high thermal conductivity rod 330 into the body of liquid phase change material 322, and/or through the plurality of side beams 336, and into and through the second wall of the thermally conductive housing, thereby providing accelerated cooling of the heat source HS through additional heat exchange with the ambient environment.

As in the previous embodiment, the phase change material comprising the body of liquid phase change material 322 is selected such that after forming a vapor V by exposure to heat from the heat source HS, the vapor V will condense back into a condensate C when exposed, through the plurality of condensing fins 324, to the conditions of the ambient environment within which the heat sink will be operating. The selection of the phase change material comprising the body of liquid phase change material 322 may depend upon a number of conditions, including anticipated pressure in the internal chamber 318, the external temperature during operation, and the surface area of each of the plurality of condensing fins 324. Under otherwise standard conditions, such as atmospheric temperature, the phase change material comprising the body of liquid phase change material 322 will have a boiling point slightly above the temperature of the ambient environment. By way of non-limiting example, where the plurality of condensing fins 324 has a larger surface area, the phase change material comprising the body of liquid phase change material 322 may be selected to have a boiling point 1° to 5° C. above the temperature of the ambient environment. By way of non-limiting example, where the plurality of condensing fins 324 has a smaller surface area, the phase change material comprising the body of liquid phase change material 322 may be selected to have a boiling point 5° to 10° C. above the temperature of the ambient environment.

Generally, the anticipated atmospheric temperature and the surface area of the plurality of condensing fins 324 will be the primary criteria used to select an appropriate phase change material for use in the body of liquid phase change material 322. Multiple phase change materials having different boiling points within the desired range of operation may be mixed in the body of liquid phase change material 322 in order to smooth the temperature range of phase change under varying ambient conditions. The pressure of the internal chamber 318 may also be adjusted to optimize the boiling point of the selected liquid phase change material for a particular intended use.

Non-limiting examples of liquid phase change materials suitable for use in the body of liquid phase change material 322 include one or more of water, formic acid, caprylic acid, glycerin, acetic acid, polyethylene glycol 600, n-hexadecane and n-heptadecane.

As in the previous embodiment, the material for use in the high thermal conductivity medium 320 may be a phase change material. If the material for use in the high thermal conductivity medium 320 is not a phase change material, a suitable material may be selected with a particularly high thermal conductivity, such as copper, aluminum, or the like. If the material for use in the high thermal conductivity medium 320 is a phase change material, the phase change material for use in the high thermal conductivity medium 320 is selected such that it has a melting temperature between the operating temperature of the heat sink 300 and the boiling temperature of the at least one liquid phase change material 322. Multiple phase change materials having different melting points within the desired range of operation may be mixed in the high thermal conductivity medium 320 in order to smooth the temperature range of phase change under varying ambient conditions. Non-limiting examples of solid phase change materials suitable for use in the high thermal conductivity medium 320 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 320, the heat from the heat source HS may also cause at least a portion of the high thermal conductivity medium 320 to melt. The high thermal conductivity medium 320 will thus absorb and store additional heat until it can be transferred to the body of liquid phase change material 322, cooling the melted portion of the high thermal conductivity medium 320 and allowing it to freeze. It should be understood that in use the high thermal conductivity medium 320 may be in a solid state, a partially melted state, or a liquid state.

It should be further understood that in use the body of liquid phase change material 322 may be in a liquid state, a partially gaseous state, or a gaseous state.

As shown in the previous embodiment, the heat sink with condensing fins and phase change material 300 may include at least one encapsulated phase change material 328 disposed within the high thermal conductivity medium 320. The at least one encapsulated phase change material 328 may be a liquid phase change material or a solid phase change material. The materials selected to encapsulate the at least one encapsulated phase change material 328 may be chosen to expand in size when subjected to increased internal pressure and/or increased temperature and to contract in size when subjected to reduced internal pressure and/or decreased temperature. The at least one encapsulated phase change material 328 may include nano, micro, or meso sized particles, or a combination thereof. The use of varying materials or varying sizes of the at least one encapsulated phase change material 328 may prevent clustering of the at least one encapsulated phase change material 328 particles. If the thermally conductive component 362 and the at least one encapsulated phase change material 328 are both present in the same embodiment, the pore size of the thermally conductive component may be selected to allow the at least one encapsulated phase change material 328 to readily pass through the pores of the thermally conductive component 362. The concentration of the at least one encapsulated phase change material 328 particles may be varied to optimize performance.

In use, the at least one encapsulated phase change material will absorb and store heat from the high thermal conductivity medium 320. The at least one encapsulated phase change material 328 will be particularly useful where the high thermal conductivity medium 320 is either partially or entirely melted. The at least one encapsulated phase change material 328 will initially be sufficiently dense to remain near the bottom of the high thermal conductivity medium 320. Should the high thermal conductivity medium 320 remain in the solid state, the at least one encapsulated phase change material 328 will remain as is. However, as the high thermal conductivity medium 320 melts and transitions to a liquid state, this will permit the at least one encapsulated phase change material 328 to heat up and change phase. This can cause the material encapsulating the at least one encapsulated phase change material 328 to be subjected to increased internal pressure and increased heat, and thus begin to expand. As the material encapsulating the at least one encapsulated phase change material 328 expands, it's buoyancy force will increase and the at least one encapsulated phase change material 328 will begin to rise through the melted high thermal conductivity medium 320, until the at least one encapsulated phase change material 28 encounters a cooler region of high thermal conductivity medium 320 and begins to cool/shrink, causing the at least one encapsulated phase change material 328 to eventually sink back to the lower portion of the high thermal conductivity medium 320. The at least one encapsulated phase change material 328 may also rise into the body of liquid phase change material 322, before cooling and shrinking in size sufficiently to return to the lower portion of the high thermal conductivity medium 320. This process increases the rate of heat transfer from the portion of the high thermal conductivity medium 320 near the heat source HS to the portion of the high thermal conductivity medium 320 near the body of liquid phase change material 322, partially due to agitation and mixing of the high thermal conductivity medium 320.

The materials selected to encapsulate the at least one encapsulated phase change material 328 may further be selected to optimize ascending and descending behavior of the at least one encapsulated phase change material 328 under specific targeted operating conditions (such as anticipated temperature of the high thermal conductivity medium 320 while operating). The size and kind of phase change material used for the at least one encapsulated phase change material 328 may vary, thus varying the temperature and/or the amount of heat captured or given off by the at least one encapsulated phase change material 328 required to cause the at least one encapsulated phase change material 328 to ascend or descend, and thereby maximizing the level of mixing and agitation of the high thermal conductivity medium 320 and of the interface between the high thermal conductivity medium 320 and the body of liquid phase change material 322. This dynamic agitation will assist in ensuring that the at least one encapsulated phase change material 328 does not aggregate at the interface of the high thermal conductivity medium 320 and the body of liquid phase change material 322.

If present, the phase change material used in the at least one encapsulated phase change material 328 is selected such that it has a phase change temperature between the highest boiling temperature of the phase change materials used in the body of liquid phase change material 322 and the highest melting temperature of phase change materials used in the high thermal conductivity medium 320. Non-limiting examples of liquid phase change materials useful as encapsulated phase change materials 328 include one or more of water, formic acid, caprylic acid, glycerin, acetic acid, polyethylene glycol 600, n-hexadecane and n-heptadecane. Non-limiting examples of solid phase change materials useful as encapsulated phase change materials 328 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

Figure 5:
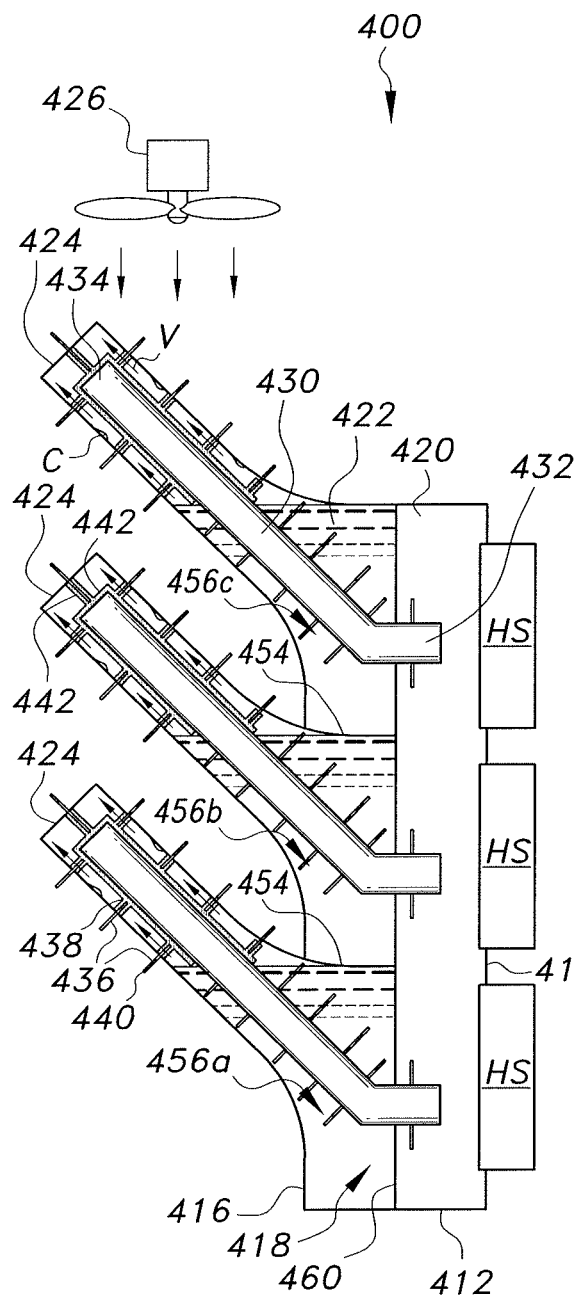
FIG. 5 is a side view in section of a heat sink with condensing fins and phase change material including the high thermal conductivity medium, at least one high thermal conductivity rod and a plurality of side beams, wherein the wall of the thermally conductive housing forming the condensing fins includes at least one extension extending between each of the at least one condensing fins and thereby creating separate sub-chambers containing the body of liquid phase change material and wherein the at least one high thermal conductivity rod and the condensing fins are angled.

In the alternative embodiment of FIG. 5, the heat sink with condensing fins and phase change material, designated generally as 400, is formed from a thermally conductive housing 412, the thermally conductive housing 412 having a first wall 414 and an opposed second wall 416 and the thermally conductive housing forming an internal chamber 418. The first wall 414 of the thermally conductive housing 412 is adapted to be in direct contact with one or more heat sources HS. As shown in FIG. 5, three heat sources HS are present; however, it should be understood that any number of heat sources HS may be used. A high thermal conductivity medium 420 is disposed within the internal chamber 418, in direct contact with the first wall 414 of the thermally conductive housing 412 and opposite the one or more heat sources HS. A body of liquid phase change material 422 is disposed within the internal chamber 418, between the high thermal conductivity medium 420 and the second wall 416 of the thermally conductive housing 412. The second wall 416 of the thermally conductive housing 412 is adapted to form a plurality of condensing fins 424. In some embodiments, the exterior wall of the plurality of condensing fins 424 may be in direct contact with any type of external cooling fin generally known in the art (not shown). It should be understood that the overall configuration and relative dimensions of the thermally conductive housing 412, the high thermal conductivity medium 420, the body of liquid phase change material 422, and the plurality of condensing fins 424 are shown for purposes of illustration only.

In the alternative embodiment of FIG. 5, the one or more heat sources HS are oriented in a vertical plane or an inclined plane. In one embodiment, the one or more heat sources HS may be partially embedded in the high thermal conductivity medium 420.

In the alternative embodiment of FIG. 5, the second wall 416 of the thermally conductive housing 412 includes at least one extension 454, extending between each of the plurality of condensing fins 424 to the high thermal conductivity medium 420, and creating sub-chambers 456a, 456b, 456c, each containing a portion of the body of liquid phase change material 422.

In the alternative embodiment of FIG. 5 a partition wall 460 separates the high thermal conductivity medium 420 from the body of liquid phase change material 422. The partition wall 460 may be flat, or it may be corrugated or finned on both sides to maximize heat transfer between the high thermal conductivity medium 420 and the liquid phase change material 422.

As in the previous embodiments, at least one high thermal conductivity rod 430 having a first end 432 and an opposed second end 434 is disposed within each of the sub-chambers 456a, 456b, and 456c. The first end 432 of each of the at least one high thermal conductivity rods 430 is disposed in the high thermal conductivity medium 420. The second end 434 of each of the at least one high thermal conductivity rods 430 extends into one of the plurality of condensing fins 424. A plurality of side beams 436, having a first end 438 and an opposed second end 440, connect each of the at least one high thermal conductivity rods 430 to the second wall 416 of the thermally conductive housing. The first end 438 of each of the plurality of side beams 436 is attached to one of the at least one high thermal conductivity rods 430. At least some of the plurality of side beams 436 extends through the second wall 416 of the thermally conductive housing 412 and the second end 440 of each of the plurality of side beams 436 is outside the thermally conductive housing 412. The second end 440 of the rest of the plurality of side beams 436 may extend into the high thermal conductivity medium 420 or the body of liquid phase change material 422. The plurality of side beams 436 may be made of any high thermal conductivity material suitable for conducting heat.

As in the previous embodiment, an insulating material 442 may line some, or all of the portion of the outer surface of at least one of the at least one high thermal conductivity rods 430 that is outside the high thermal conductivity medium 420 and the body of liquid phase change material 422. The insulating material 442 may be a ceramic coating, a thin film coating such as a nanomaterial, or the like. The insulating material 442 may also line none, some, or all, of the portion of the outer surface of the plurality of side beams 436 that is within the thermally conductive housing 412.

As in the previous embodiment, the insulating material 442 reduces heat exchange between both the at least one high thermal conductivity rod 430 and the plurality of side beams 436 and the vapor V, which could interfere with the rate of condensation.

In the alternative embodiment of FIG. 5, each of the at least one high thermal conductivity rods 430 and the plurality of condensing fins may be angled. In some embodiments, the angle may be up in the vertical direction.

In use, heat generated by the heat source HS is transferred, via conduction, through the thermally conductive housing 412 and into the high thermal conductivity medium 420. In addition to the heat transferred into the high thermal conductivity medium 420, heat can further be transferred from the high thermal conductivity medium 420 through the partition wall 460 and into the body of liquid phase change material 422. The heat may cause at least a portion of the body of liquid phase change material 422 to evaporate, and the vapor V may flow into the plurality of condensing fins 424, where the vapor V is cooled through heat exchange with the ambient environment. The rate of cooling may be enhanced by one or more fans 426 blowing air across the plurality of condensing fins 424. The cooling of the vapor V may condense the evaporated liquid phase change material into a condensate C, and the condensate C may drip, under the force of gravity, back into the at least one internal chamber 418 for reuse, thereby aiding in cooling the heat source HS.

The presence of the high thermal conductivity medium 420 may be particularly useful to prevent heat flux conditions at the first wall 414 from causing a vapor film to cover the first wall 414, which could in turn lead to damage to the heat source HS. The high thermal conductivity medium 420, when combined with the body of liquid phase change material 422, may enhance heat removal, thereby preventing heat flux conditions from causing potential damage to the heat source HS.

As in the previous embodiments, heat may also be transferred by conduction from the high thermal conductivity medium 420, or the body of liquid phase change material 422, into the at least one high thermal conductivity rod 430, and from the at least one high thermal conductivity rod 430 into the body of liquid phase change material 422, and/or through the plurality of side beams 436, and into the second wall of the thermally conductive housing, thereby providing accelerated cooling of the heat source HS.

The phase change material comprising the body of liquid phase change material 422 is selected such that after forming a vapor V by exposure to heat from the heat source HS, the vapor V will condense back into a condensate C when exposed, through the plurality of condensing fins 424, to the conditions of the ambient environment within which the heat sink will be operating. The selection of the phase change material comprising the body of liquid phase change material 422 may depend upon a number of conditions, including anticipated pressure in the internal chamber 418, the external temperature during operation, and the surface area of each of the plurality of condensing fins 424. Under otherwise standard conditions, such as atmospheric temperature, the phase change material comprising the body of liquid phase change material 422 will have a boiling point slightly above the temperature of the ambient environment. By way of non-limiting example, where the plurality of condensing fins 424 has a larger surface area, the phase change material comprising the body of liquid phase change material 422 may be selected to have a boiling point 1° to 5° C. above the temperature of the ambient environment. By way of non-limiting example, where the plurality of condensing fins 424 has a smaller surface area, the phase change material comprising the body of liquid phase change material 422 may be selected to have a boiling point 5° to 10° C. above the temperature of the ambient environment.

Generally, the anticipated atmospheric temperature and the surface area of the plurality of condensing fins 424 will be the primary criteria used to select an appropriate phase change material for use in the body of liquid phase change material 422. Multiple phase change materials having different boiling points within the desired range of operation may be mixed in the body of liquid phase change material 422 in order to smooth the temperature range of phase change under varying ambient conditions. The pressure of the internal chamber 418 may also be adjusted to optimize the boiling point of the selected liquid phase change material for a particular intended use.

Non-limiting examples of liquid phase change materials suitable for use in the body of liquid phase change material 422 include one or more of water, formic acid, caprylic acid, glycerin, acetic acid, polyethylene glycol 600, n-hexadecane and n-heptadecane.

As in the previous embodiment, the material for use in the high thermal conductivity medium 420 may be a phase change material. If the material for use in the high thermal conductivity medium 420 is not a phase change material, a suitable material may be selected with a particularly high thermal conductivity, such as copper, aluminum, or the like. If the material for use in the high thermal conductivity medium 420 is a phase change material, the phase change material for use in the high thermal conductivity medium 420 is selected such that it has a melting temperature between the operating temperature of the heat sink 400 and the boiling temperature of the at least one liquid phase change material 422. Multiple phase change materials having different melting points within the desired range of operation may be mixed in the high thermal conductivity medium 420 in order to smooth the temperature range of phase change under varying ambient conditions. Non-limiting examples of solid phase change materials suitable for use in the high thermal conductivity medium 420 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 420, the heat from the heat source HS may also cause at least a portion of the high thermal conductivity medium 420 to melt. The high thermal conductivity medium 420 will thus absorb and store additional heat until it can be transferred to the body of liquid phase change material 418, cooling the melted portion of the high thermal conductivity medium 420 and allowing it to freeze. It should be understood that in use the high thermal conductivity medium 420 may be in a solid state, a partially melted state, or a liquid state.

It should be further understood that in use the body of liquid phase change material 422 may be in a liquid state, a partially gaseous state, or a gaseous state.

Figure 6:
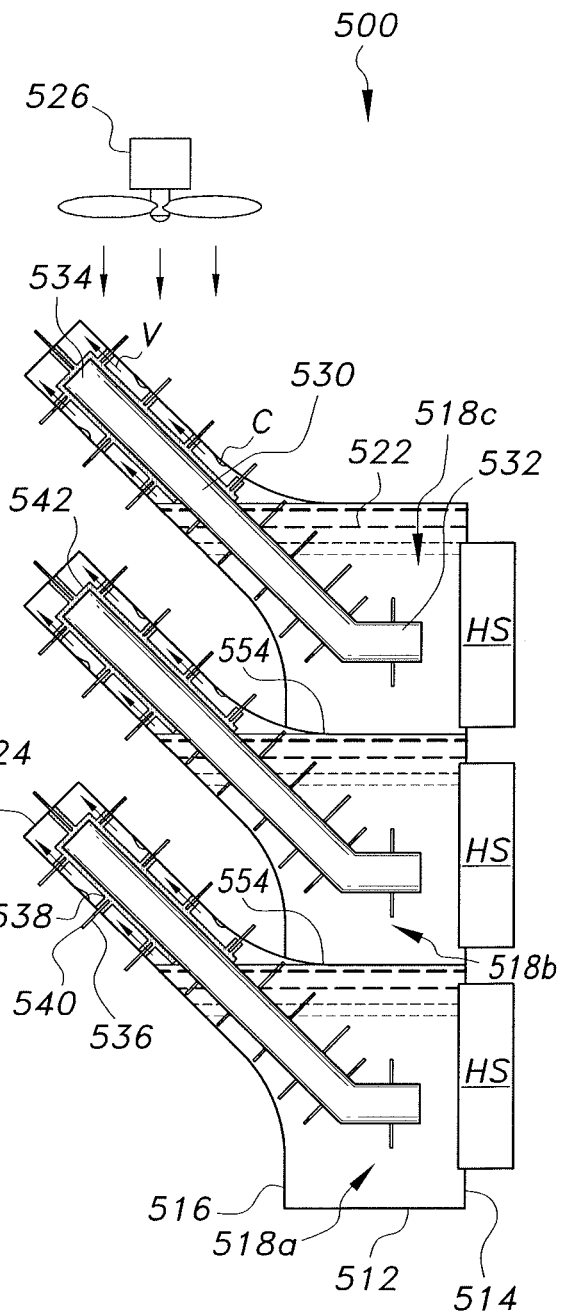
FIG. 6 is a side view in section of a heat sink with condensing fins and phase change material including at least one high thermal conductivity rod and a plurality of side beams, wherein the high thermal conductivity medium is not present, and wherein the wall of the thermally conductive housing forming the condensing fins includes at least one extension extending between each of the at least one condensing fins and creating sub-chambers containing the body of liquid phase change material and wherein the at least one high thermal conductivity rod and the condensing fins are angled.

In the alternative embodiment of FIG. 6, the heat sink with condensing fins and phase change material, designated generally as 500, is formed from a thermally conductive housing 512, the thermally conductive housing 512 having a first wall 514 and an opposed second wall 516 and the thermally conductive housing forming at least one internal chamber 518a, 518b, 518c. The first wall 514 of the thermally conductive housing 512 is adapted to be in direct contact with one or more heat sources HS. As shown in FIG. 6, three heat sources HS are present; however, it should be understood that any number of heat sources HS may be used A body of liquid phase change material 522 is disposed within each of the at least one internal chambers 518a, 518b, 518c, in direct contact with the first wall 514 of the thermally conductive housing 512 and opposite the one or more heat sources HS. The second wall 516 of the thermally conductive housing 512 is adapted to form a plurality of condensing fins 524. In some embodiments, the exterior wall of the plurality of condensing fins 524 may be in direct contact with any type of external cooling fin generally known in the art (not shown). It should be understood that the overall configuration and relative dimensions of the thermally conductive housing 512, the body of liquid phase change material 522, and the plurality of condensing fins 524 are shown for purposes of illustration only.

In the alternative embodiment of FIG. 6, the one or more heat sources HS are oriented in a vertical plane or an inclined plane.

In the alternative embodiment of FIG. 6, the second wall 516 of the thermally conductive housing 512 includes at least one extension 554, extending between each of the plurality of condensing fins 524 to the first wall 514 of the thermally conductive housing 512, and creating each of the at least one internal chambers 518a, 518b, 518c, each containing a portion of the body of liquid phase change material 522.

In the alternative embodiment of FIG. 6, at least one high thermal conductivity rod 530 having a first end 532 and an opposed second end 534 is disposed within each of the at least one internal chambers 518a, 518b, 518c. The first end 532 of each of the at least one high thermal conductivity rods 530 is disposed in the body of liquid phase change material 522. The second end 534 of each of the at least one high thermal conductivity rods 530 extends into one of the plurality of condensing fins 524. A plurality of side beams 536, having a first end 538 and an opposed second end 540, connect each of the at least one high thermal conductivity rods 530 to the second wall 516 of the thermally conductive housing 512. The first end 538 of each of the plurality of side beams 536 is attached to one of the at least one high thermal conductivity rods 530. At least some of the plurality of side beams 536 extends through the second wall 516 of the thermally conductive housing 512 and the second end 540 of each of the plurality of side beams 536 is outside the thermally conductive housing 512. The second end 540 of the rest of the plurality of side beams 536 may extend into the body of liquid phase change material 522. The plurality of side beams 536 may be made of any high thermal conductivity material suitable for conducting heat.

As in the previous embodiment, an insulating material 542 may line some, or all of the portion of the outer surface of at least one of the at least one high thermal conductivity rods 530 that is outside the body of liquid phase change material 522. The insulating material 542 may be a ceramic coating, a thin film coating such as a nanomaterial, or the like. The insulating material 542 may also line none, some, or all, of the portion of the outer surface of the plurality of side beams 536 that is within the thermally conductive housing 512.

As in the previous embodiment, the insulating material 542 reduces heat exchange between both the at least one high thermal conductivity rod 530 and the plurality of side beams 536 and the vapor V, which could interfere with the rate of condensation.

In the alternative embodiment of FIG. 6, each of the at least one high thermal conductivity rods 530 and the plurality of condensing fins may be angled. In some embodiments, the angle may be up in the vertical direction.

In use, heat generated by the heat source HS is transferred, via conduction, through the thermally conductive housing 512 and into the body of liquid phase change material 522. The heat may cause at least a portion of the body of liquid phase change material 522 to evaporate, and the vapor V may flow into the plurality of condensing fins 524, where the vapor V is cooled through heat exchange with the ambient environment. The rate of cooling may be enhanced by one or more fans 526 blowing air across the plurality of condensing fins 524. The cooling of the vapor V may condense the evaporated liquid phase change material into a condensate C, and the condensate C may drip, under the force of gravity, back into the at least one internal chamber 518 for reuse, thereby aiding in cooling the heat source HS. It should be understood that in use the body of liquid phase change material 522 may be in a liquid state, a partially gaseous state, or a gaseous state.

As in the previous embodiments, heat may also be transferred by conduction and convection from the body of liquid phase change material 522, into the at least one high thermal conductivity rod 530, and from the at least one high thermal conductivity rod 530, through the plurality of side beams 536, and into the second wall of the thermally conductive housing, thereby providing accelerated cooling of the heat source HS.

The phase change material comprising the body of liquid phase change material 522 is selected such that after forming a vapor V by exposure to heat from the heat source HS, the vapor V will condense back into a condensate C when exposed, through the plurality of condensing fins 524, to the conditions of the ambient environment within which the heat sink will be operating. The selection of the phase change material comprising the body of liquid phase change material 522 may depend upon a number of conditions, including anticipated pressure in the internal chamber 518, the external temperature during operation, and the surface area of each of the plurality of condensing fins 524. Under otherwise standard conditions, such as atmospheric temperature, the phase change material comprising the body of liquid phase change material 522 will have a boiling point slightly above the temperature of the ambient environment. By way of non-limiting example, where the plurality of condensing fins 524 has a larger surface area, the phase change material comprising the body of liquid phase change material 522 may be selected to have a boiling point 1° to 5° C. above the temperature of the ambient environment. By way of non-limiting example, where the plurality of condensing fins 524 has a smaller surface area, the phase change material comprising the body of liquid phase change material 522 may be selected to have a boiling point 5° to 10° C. above the temperature of the ambient environment.

Generally, the anticipated atmospheric temperature and the surface area of the plurality of condensing fins 524 will be the primary criteria used to select an appropriate phase change material for use in the body of liquid phase change material 522. Multiple phase change materials having different boiling points within the desired range of operation may be mixed in the body of liquid phase change material 522 in order to smooth the temperature range of phase change under varying ambient conditions. The pressure of the internal chamber 518 may also be adjusted to optimize the boiling point of the selected liquid phase change material for a particular intended use.

Non-limiting examples of liquid phase change materials suitable for use in the body of liquid phase change material 522 include one or more of water, formic acid, caprylic acid, glycerin, acetic acid, polyethylene glycol 600, n-hexadecane and n-heptadecane.

Figure 7:
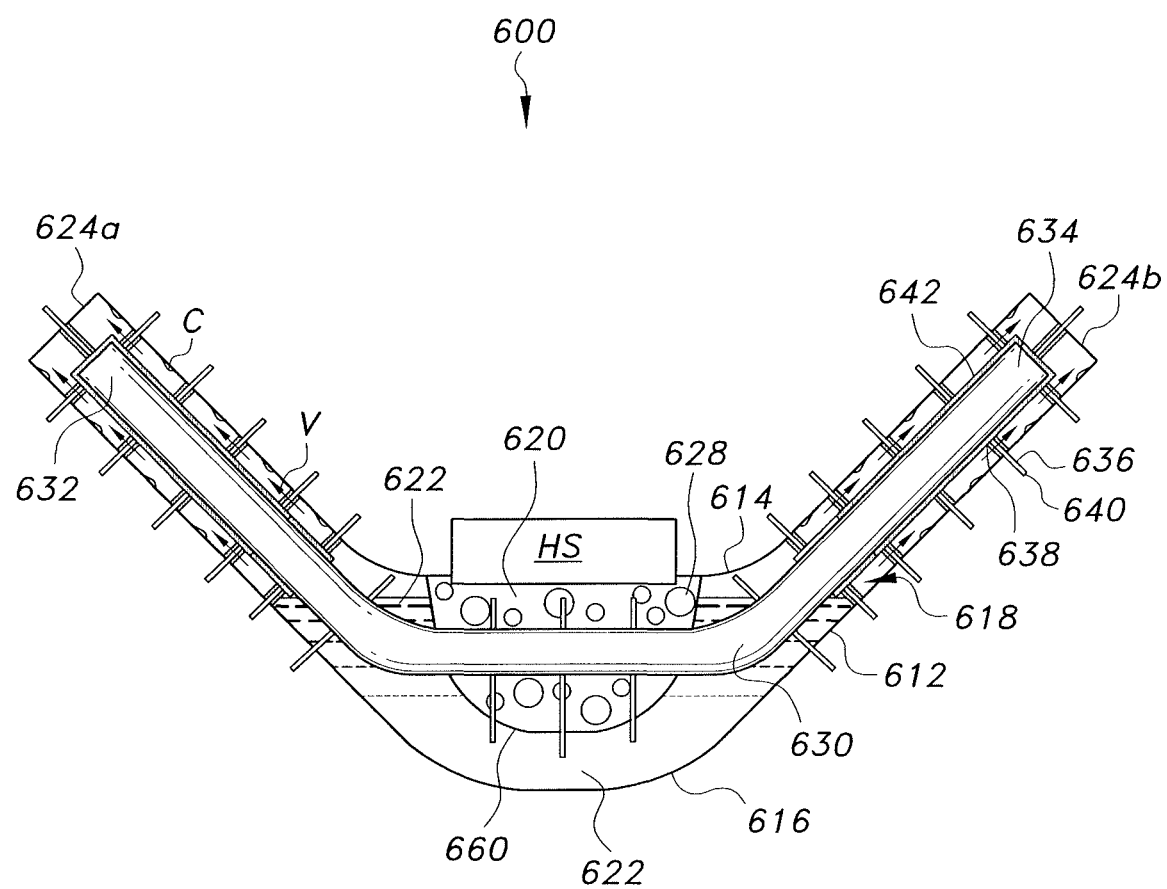
FIG. 7 is a side view in section of a heat sink with condensing fins and phase change material including at least one high thermal conductivity rod and a plurality of side beams, having at least two condensing fins, wherein each of the at least one high thermal conductivity rods extends between two of the at least two condensing fins and each of the at least two condensing fins and each of the at least one high thermal conductivity rods are angled towards the heat source.

In the alternative embodiment of FIG. 7, the heat sink with condensing fins and phase change material, designated generally as 600, is formed from a thermally conductive housing 612, the thermally conductive housing 612 having a first wall 614 and an opposed second wall 616 and the thermally conductive housing forming an internal chamber 618. The first wall 614 of the thermally conductive housing 612 is adapted to be in direct contact with one or more heat sources HS. As shown in FIG. 7, a single heat sources HS is present; however, it should be understood that any number of heat sources HS may be used. A high thermal conductivity medium 620 is disposed within the internal chamber 618, in direct contact with the first wall 614 of the thermally conductive housing 612 and opposite the one or more heat sources HS.

In an embodiment, the one or more heat sources HS may be partially embedded in the high thermal conductivity medium 620. A body of liquid phase change material 622 is disposed within the internal chamber 618, in direct contact with the high thermal conductivity medium 620 and the second wall 616 of the thermally conductive housing 612. In the alternative embodiment of FIG. 7, the first wall 614 of the thermally conductive housing and the second wall 616 of the thermally conductive housing 612 are angled toward the heat source HS and adapted to form at least two condensing fins 624a, 624b. In some embodiments, the exterior wall of the at least two condensing fins 624a, 624b, may be in direct contact with any type of external cooling fin generally known in the art (not shown). It should be understood that the overall configuration and relative dimensions of the thermally conductive housing 612, the high thermal conductivity medium 620, the body of liquid phase change material 622, and the at least two condensing fins 624 are shown for purposes of illustration only.

In the alternative embodiment of FIG. 7, at least one high thermal conductivity rod 630 having a first end 632 and an opposed second end 634 is disposed within the internal chamber 618. The first end 632 of each of the at least one high thermal conductivity rods 630 extends into one of the at least two condensing fins 624a. The second end 634 of each of the at least one high thermal conductivity rods 630 extends into a different one of the at least two condensing fins 624b. The high thermal conductivity rod 630 extends through the high thermal conductivity medium 620 and the body of liquid phase change material 622.

In the alternative embodiment of FIG. 7 a partition wall 660 separates the high thermal conductivity medium 620 from the body of liquid phase change material 622. The partition wall 660 may be made from any suitable high thermal conductivity material. The partition wall 660 may be flat, or it may be corrugated or finned on both sides to maximize heat transfer between the high thermal conductivity medium 620 and the liquid phase change material 622.

As in the previous embodiments, a plurality of side beams 636, having a first end 638 and an opposed second end 640, connect each of the at least one high thermal conductivity rods 630 to the first wall 614 or the second wall 616 of the thermally conductive housing. The first end 638 of each of the plurality of side beams 636 is attached to one of the at least one high thermal conductivity rods 630. At least some of the plurality of side beams 636 extends through the first wall 614 or the second wall 616 of the thermally conductive housing 612 and the second end 640 of each of the plurality of side beams 636 is outside the thermally conductive housing 612. The second end 640 of the rest of the plurality of side beams 636 may extend into the high thermal conductivity medium 620 or the body of liquid phase change material 622. The plurality of side beams 636 may be made of any high thermal conductivity material suitable for conducting heat.

As in the previous embodiments, an insulating material 642 may line some, or all of the portion of the outer surface of at least one of the at least one high thermal conductivity rods 630 that is outside the high thermal conductivity medium 620 and the body of liquid phase change material 622. The insulating material 642 may be a ceramic coating, a thin film coating such as a nanomaterial, or the like. The insulating material 642 may also line none, some, or all, of the portion of the outer surface of the plurality of side beams 636 that is within the thermally conductive housing 612.

In use, heat generated by the heat source HS is transferred, via conduction, through the thermally conductive housing 612 and into the high thermal conductivity medium 620. In addition to the heat transferred into the high thermal conductivity medium 620, heat can further be transferred from the high thermal conductivity medium 620 through the partition wall 660 and into the body of liquid phase change material 622. The heat may cause at least a portion of the body of liquid phase change material 622 to evaporate, and the vapor V may flow into the at least two condensing fins 624a, 624b, where the vapor V is cooled through heat exchange with the ambient environment. The cooling of the vapor V may condense the evaporated liquid phase change material into a condensate C, and the condensate C may drip, under the force of gravity, back into the at least one internal chamber 618 for reuse, thereby aiding in cooling the heat source HS.

In the alternative embodiment of FIG. 7, heat may also be transferred by conduction from the high thermal conductivity medium 620, or the body of liquid phase change material 622, into the at least one high thermal conductivity rod 630, and from the at least one high thermal conductivity rod 630 into the body of liquid phase change material 622, and/or through the plurality of side beams 636, and into and through the portion of the thermally conductive housing 612 forming the at least two condensing fins 624a, 624b, thereby providing accelerated cooling of the heat source HS through additional heat exchange with the ambient environment.

As in the previous embodiment, the insulating material 642 reduces heat exchange between both the at least one high thermal conductivity rod 630 and the plurality of side beams 636 and the vapor V, which could interfere with the rate of condensation.

The phase change material comprising the body of liquid phase change material 622 is selected such that after forming a vapor V by exposure to heat from the heat source HS, the vapor V will condense back into a condensate C when exposed, through the at least two condensing fins 624a, 624b, to the conditions of the ambient environment within which the heat sink will be operating. The selection of the phase change material comprising the body of liquid phase change material 622 may depend upon a number of conditions, including anticipated pressure in the internal chamber 618, the external temperature during operation, and the surface area of each of the at least two condensing fins 624a, 624b. Under otherwise standard conditions, such as atmospheric temperature, the phase change material comprising the body of liquid phase change material 622 will have a boiling point slightly above the temperature of the ambient environment. By way of non-limiting example, where the at least two condensing fins 624a, 624b have a larger surface area, the phase change material comprising the body of liquid phase change material 622 may be selected to have a boiling point 1° to 5° C. above the temperature of the ambient environment. By way of non-limiting example, where the at least two condensing fins 624a, 624b have a smaller surface area, the phase change material comprising the body of liquid phase change material 622 may be selected to have a boiling point 5° to 10° C. above the temperature of the ambient environment.

Generally, the anticipated atmospheric temperature and the surface area of the at least two condensing fins 624a, 624b will be the primary criteria used to select an appropriate phase change material for use in the body of liquid phase change material 622. Multiple phase change materials having different boiling points within the desired range of operation may be mixed in the body of liquid phase change material 622 in order to smooth the temperature range of phase change under varying ambient conditions. The pressure of the internal chamber 618 may also be adjusted to optimize the boiling point of the selected liquid phase change material for a particular intended use.

Non-limiting examples of liquid phase change materials suitable for use in the body of liquid phase change material 622 include one or more of water, formic acid, caprylic acid, glycerin, acetic acid, polyethylene glycol 600, n-hexadecane and n-heptadecane.

The material for use in the high thermal conductivity medium 620 may be a phase change material. If the material for use in the high thermal conductivity medium 620 is not a phase change material, a suitable material may be selected with a particularly high thermal conductivity, such as copper, aluminum, or the like. If the material for use in the high thermal conductivity medium 620 is a phase change material, the phase change material for use in the high thermal conductivity medium 620 is selected such that it has a melting temperature between the operating temperature of the heat sink 600 and the boiling temperature of the at least one liquid phase change material 622. Multiple phase change materials having different melting points within the desired range of operation may be mixed in the high thermal conductivity medium 620 in order to smooth the temperature range of phase change under varying ambient conditions. Non-limiting examples of solid phase change materials suitable for use in the high thermal conductivity medium 620 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 620, the heat from the heat source HS may also cause at least a portion of the high thermal conductivity medium 620 to melt. The high thermal conductivity medium 620 will thus absorb and store additional heat until it can be transferred to the body of liquid phase change material 618, cooling the melted portion of the high thermal conductivity medium 620 and allowing it to freeze. It should be understood that in use the high thermal conductivity medium 620 may be in a solid state, a partially melted state, or a liquid state.

It should be further understood that in use the body of liquid phase change material 622 may be in a liquid state, a partially gaseous state, or a gaseous state.

As shown in the previous embodiments of FIGS. 1-5, the heat sink with condensing fins and phase change material 600 may include at least one encapsulated phase change material 628 disposed within the high thermal conductivity medium 620. The at least one encapsulated phase change material 628 may be a liquid phase change material or a solid phase change material.

If present, the phase change material used in the at least one encapsulated phase change material 628 is selected such that it has a phase change temperature between the highest boiling temperature of the phase change materials used in the body of liquid phase change material 622 and the highest melting temperature of phase change materials used in the high thermal conductivity medium 620. Non-limiting examples of liquid phase change materials useful as encapsulated phase change materials 628 include one or more of water, formic acid, caprylic acid, glycerin, acetic acid, polyethylene glycol 600, n-hexadecane and n-heptadecane. Non-limiting examples of solid phase change materials useful as encapsulated phase change materials 628 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

In a further alternative embodiment of FIG. 7, either the high thermal conductivity medium 620, or the body of liquid phase change material 622, but not both, may be omitted entirely. This embodiment is particularly suited for configurations where the heat source HS is located on top of the heat sink with condensing fins and phase change material. This embodiment may be of particular interest in PV cell or LED applications, and the like.

Figure 8:
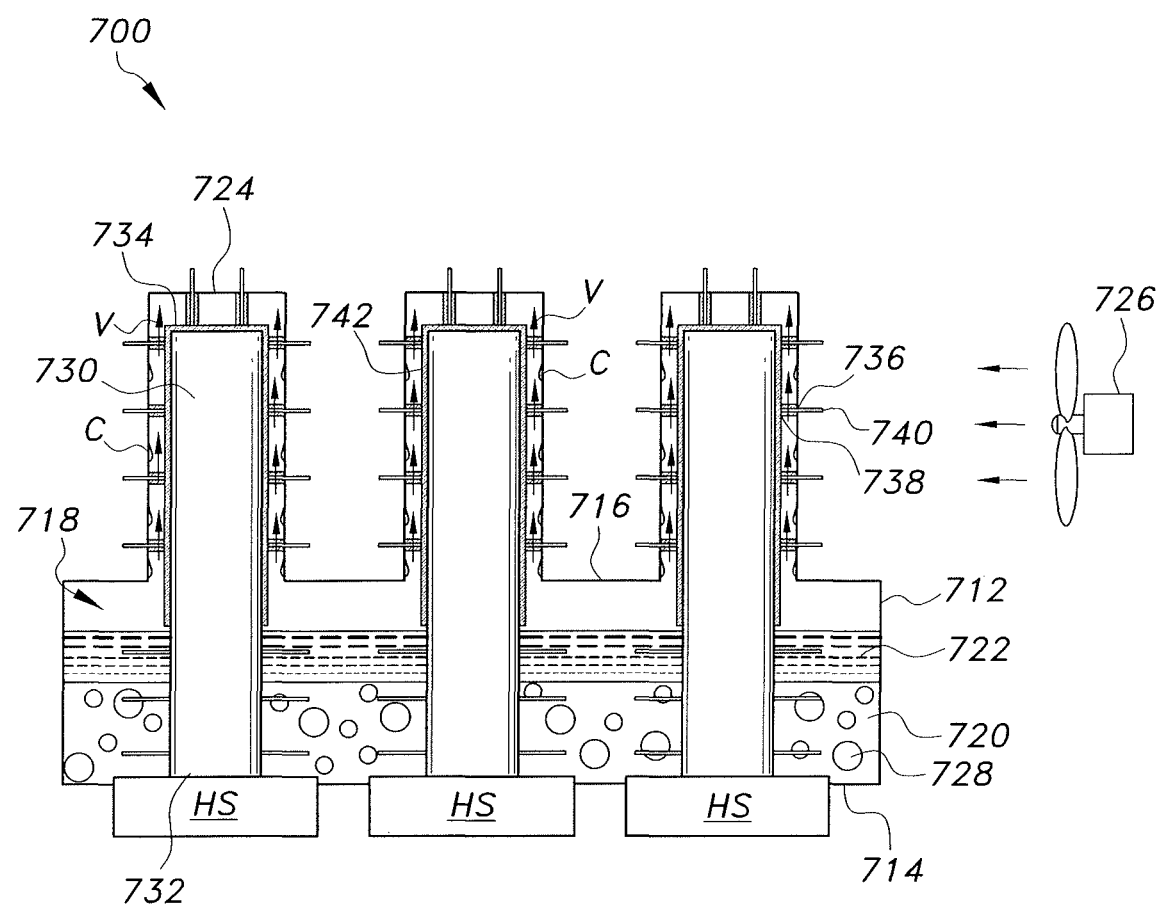
FIG. 8 is a side view in section of a heat sink with condensing fins and phase change material including at least one high thermal conductivity rod and a plurality of side beams, wherein each of the at least one high thermal conductivity rods is in direct contact with a heat source.

In the alternative embodiment of FIG. 8, the heat sink with condensing fins and phase change material, designated generally as 700, is formed from a thermally conductive housing 712, the thermally conductive housing 712 having a first wall 714 and an opposed second wall 716 and the thermally conductive housing forming an internal chamber 718. The first wall 714 of the thermally conductive housing 712 is adapted to be in direct contact with one or more heat sources HS. As shown in FIG. 8, three heat sources HS are present; however, it should be understood that any number of heat sources HS may be used. A high thermal conductivity medium 720 is disposed within the internal chamber 718, in direct contact with the first wall 714 of the thermally conductive housing 712 and opposite the one or more heat sources HS. A body of liquid phase change material 722 is disposed within the internal chamber 718, between the high thermal conductivity medium 720 and the second wall 716 of the thermally conductive housing 712. The second wall 716 of the thermally conductive housing 712 is adapted to form a plurality of condensing fins 724. In some embodiments, the exterior wall of the plurality of condensing fins 724 may be in direct contact with any type of external cooling fin generally known in the art (not shown). It should be understood that the overall configuration and relative dimensions of the thermally conductive housing 712, the high thermal conductivity medium 720, the body of liquid phase change material 722, and the plurality of condensing fins 724 are shown for purposes of illustration only.

As in the previous embodiment, at least one high thermal conductivity rod 730 having a first end 732 and an opposed second end 734 is disposed within the internal chamber 718. In the alternative embodiment of FIG. 8, the first end 732 of each of the at least one high thermal conductivity rods 730 extends through the high thermal conductivity medium 720 and is in direct contact with the first wall 714 of the thermally conductive housing 712 and/or the heat source HS. The second end 734 of each of the at least one high thermal conductivity rods 730 extends into one of the plurality of condensing fins 724.

As in the previous embodiment, a plurality of side beams 736, having a first end 738 and an opposed second end 740, connect each of the at least one high thermal conductivity rods 730 to the second wall 716 of the thermally conductive housing. The first end 738 of each of the plurality of side beams 736 is attached to one of the at least one high thermal conductivity rods 730. At least some of the plurality of side beams 736 extends through the second wall 716 of the thermally conductive housing 712 and the second end 740 of each of the plurality of side beams 736 is outside the thermally conductive housing 712. The second end 740 of the rest of the plurality of side beams 736 may extend into the high thermal conductivity medium 720 or the body of liquid phase change material 722. The plurality of side beams 736 may be made of any high thermal conductivity material suitable for conducting heat.

As in the previous embodiments, an insulating material 742 may line some, or all of the portion of the outer surface of at least one of the at least one high thermal conductivity rods 730 that is outside the high thermal conductivity medium 720 and the body of liquid phase change material 722. The insulating material 742 may be a ceramic coating, a thin film coating such as a nanomaterial, or the like. The insulating material 742 may also line none, some, or all, of the portion of the outer surface of the plurality of side beams 736 that is within the thermally conductive housing 712.

As in the previous embodiment, the insulating material 742 reduces heat exchange between both the at least one high thermal conductivity rod 730 and the plurality of side beams 736 and the vapor V, which could interfere with the rate of condensation.

In use, heat generated by the heat source HS is transferred, via conduction, through the thermally conductive housing 712 and into the high thermal conductivity medium 720. In addition to the heat transferred into the high thermal conductivity medium 720, heat can further be transferred from the high thermal conductivity medium 720 into the body of liquid phase change material 722. The heat may cause at least a portion of the body of liquid phase change material 722 to evaporate, and the vapor V may flow into the plurality of condensing fins 724, where the vapor V is cooled through heat exchange with the ambient environment. The rate of cooling may be enhanced by one or more fans 726 blowing air across the condensing fins 724. The cooling of the vapor V may condense the evaporated liquid phase change material into a condensate C, and the condensate C may drip, under the force of gravity, back into the at least one internal chamber 718 for reuse, thereby aiding in cooling the heat source HS. In the alternative embodiment of FIG. 8, heat may also be transferred by conduction from the heat source (HS), the high thermal conductivity medium 720, or the body of liquid phase change material 722, into the at least one high thermal conductivity rod 730, and from the at least one high thermal conductivity rod 730 into the body of liquid phase change material 722 and/or through the plurality of side beams 736, and into the second wall of the thermally conductive housing, thereby providing accelerated cooling of the heat source HS.

The presence of the high thermal conductivity medium 720 may be particularly useful to prevent heat flux conditions at the first wall 714 from causing a vapor film to cover the first wall 714, which could in turn lead to damage to the heat source HS. The high thermal conductivity medium 720, when combined with the body of liquid phase change material 722, may enhance heat removal, thereby preventing heat flux conditions from causing potential damage to the heat source HS.

The phase change material comprising the body of liquid phase change material 722 is selected such that after forming a vapor V by exposure to heat from the heat source HS, the vapor V will condense back into a condensate C when exposed, through the plurality of condensing fins 224, to the conditions of the ambient environment within which the heat sink will be operating. The selection of the phase change material comprising the body of liquid phase change material 722 may depend upon a number of conditions, including anticipated pressure in the internal chamber 718, the external temperature during operation, and the surface area of each of the plurality of condensing fins 724. Under otherwise standard conditions, such as atmospheric temperature, the phase change material comprising the body of liquid phase change material 722 will have a boiling point slightly above the temperature of the ambient environment. By way of non-limiting example, where the plurality of condensing fins 724 has a larger surface area, the phase change material comprising the body of liquid phase change material 722 may be selected to have a boiling point 1° to 5° C. above the temperature of the ambient environment. By way of non-limiting example, where the plurality of condensing fins 724 has a smaller surface area, the phase change material comprising the body of liquid phase change material 722 may be selected to have a boiling point 5° to 10° C. above the temperature of the ambient environment.

Generally, the anticipated atmospheric temperature and the surface area of the plurality of condensing fins 724 will be the primary criteria used to select an appropriate phase change material for use in the body of liquid phase change material 722. Multiple phase change materials having different boiling points within the desired range of operation may be mixed in the body of liquid phase change material 722 in order to smooth the temperature range of phase change under varying ambient conditions. The pressure of the internal chamber 718 may also be adjusted to optimize the boiling point of the selected liquid phase change material for a particular intended use.

Non-limiting examples of liquid phase change materials suitable for use in the body of liquid phase change material 722 include one or more of water, formic acid, caprylic acid, glycerin, acetic acid, polyethylene glycol 600, n-hexadecane and n-heptadecane.

As in the previous embodiment, the material for use in the high thermal conductivity medium 720 may be a phase change material. If the material for use in the high thermal conductivity medium 720 is not a phase change material, a suitable material may be selected with a particularly high thermal conductivity, such as copper, aluminum, or the like. If the material for use in the high thermal conductivity medium 720 is a phase change material, the phase change material for use in the high thermal conductivity medium 720 is selected such that it has a melting temperature between the operating temperature of the heat sink 700 and the boiling temperature of the at least one liquid phase change material 722. Multiple phase change materials having different melting points within the desired range of operation may be mixed in the high thermal conductivity medium 720 in order to smooth the temperature range of phase change under varying ambient conditions. Non-limiting examples of solid phase change materials suitable for use in the high thermal conductivity medium 720 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 720, the heat from the heat source HS may also cause at least a portion of the high thermal conductivity medium 720 to melt. The high thermal conductivity medium 720 will thus absorb and store additional heat until it can be transferred to the body of liquid phase change material 718, cooling the melted portion of the high thermal conductivity medium 720 and allowing it to freeze. It should be understood that in use the high thermal conductivity medium 720 may be in a solid state, a partially melted state, or a liquid state.

It should be further understood that in use the body of liquid phase change material 722 may be in a liquid state, a partially gaseous state, or a gaseous state.

As shown in the previous embodiment, the heat sink with condensing fins and phase change material 700 may include at least one encapsulated phase change material 728 disposed within the high thermal conductivity medium 720. The at least one encapsulated phase change material 728 may be a liquid phase change material or a solid phase change material. The materials selected to encapsulate the at least one encapsulated phase change material 728 may be chosen to expand in size when subjected to increased internal pressure and/or increased temperature and to contract in size when subjected to reduced internal pressure and/or decreased temperature. The at least one encapsulated phase change material 728 may include nano, micro, or meso sized particles, or a combination thereof. The use of varying materials or varying sizes of the at least one encapsulated phase change material 728 may prevent clustering of the at least one encapsulated phase change material 728 particles. The concentration of the at least one encapsulated phase change material 728 particles may be varied to optimize performance.

In use, the at least one encapsulated phase change material will absorb and store heat from the high thermal conductivity medium 720. The at least one encapsulated phase change material 728 will be particularly useful where the high thermal conductivity medium 720 is either partially or entirely melted. The at least one encapsulated phase change material 728 will initially be sufficiently dense to remain near the bottom of the high thermal conductivity medium 720. Should the high thermal conductivity medium 720 remain in the solid state, the at least one encapsulated phase change material 728 will remain as is. However, as the high thermal conductivity medium 720 melts and transitions to a liquid state, this will permit the at least one encapsulated phase change material 728 to heat up and change phase. This can cause the material encapsulating the at least one encapsulated phase change material 728 to be subjected to increased internal pressure and increased heat, and thus begin to expand. As the material encapsulating the at least one encapsulated phase change material 728 expands, it's buoyancy force will increase and the at least one encapsulated phase change material 728 will begin to rise through the melted high thermal conductivity medium 720, until the at least one encapsulated phase change material 728 encounters a cooler region of high thermal conductivity medium 720 and begins to cool/shrink, causing the at least one encapsulated phase change material 728 to eventually sink back to the lower portion of the high thermal conductivity medium 720. The at least one encapsulated phase change material 728 may also rise into the body of liquid phase change material 722, before cooling and shrinking in size sufficiently to return to the lower portion of the high thermal conductivity medium 720. This process increases the rate of heat transfer from the portion of the high thermal conductivity medium 720 near the heat source HS to the portion of the high thermal conductivity medium 720 near the body of liquid phase change material 722, partially due to agitation and mixing of the high thermal conductivity medium 720.

The materials selected to encapsulate the at least one encapsulated phase change material 728 may further be selected to optimize ascending and descending behavior of the at least one encapsulated phase change material 728 under specific targeted operating conditions (such as anticipated temperature of the high thermal conductivity medium 720 while operating). The size and kind of phase change material used for the at least one encapsulated phase change material 728 may vary, thus varying the temperature and/or the amount of heat captured or given off by the at least one encapsulated phase change material 728 required to cause the at least one encapsulated phase change material 728 to ascend or descend, and thereby maximizing the level of mixing and agitation of the high thermal conductivity medium 720 and of the interface between the high thermal conductivity medium 720 and the body of liquid phase change material 722. This dynamic agitation will assist in ensuring that the at least one encapsulated phase change material 728 does not aggregate at the interface of the high thermal conductivity medium 720 and the body of liquid phase change material 722.

If present, the phase change material used in the at least one encapsulated phase change material 728 is selected such that it has a phase change temperature between the highest boiling temperature of the phase change materials used in the body of liquid phase change material 722 and the highest melting temperature of phase change materials used in the high thermal conductivity medium 720. Non-limiting examples of liquid phase change materials useful as encapsulated phase change materials 728 include one or more of water, formic acid, caprylic acid, glycerin, acetic acid, polyethylene glycol 600, n-hexadecane and n-heptadecane. Non-limiting examples of solid phase change materials useful as encapsulated phase change materials 728 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

Figure 9:
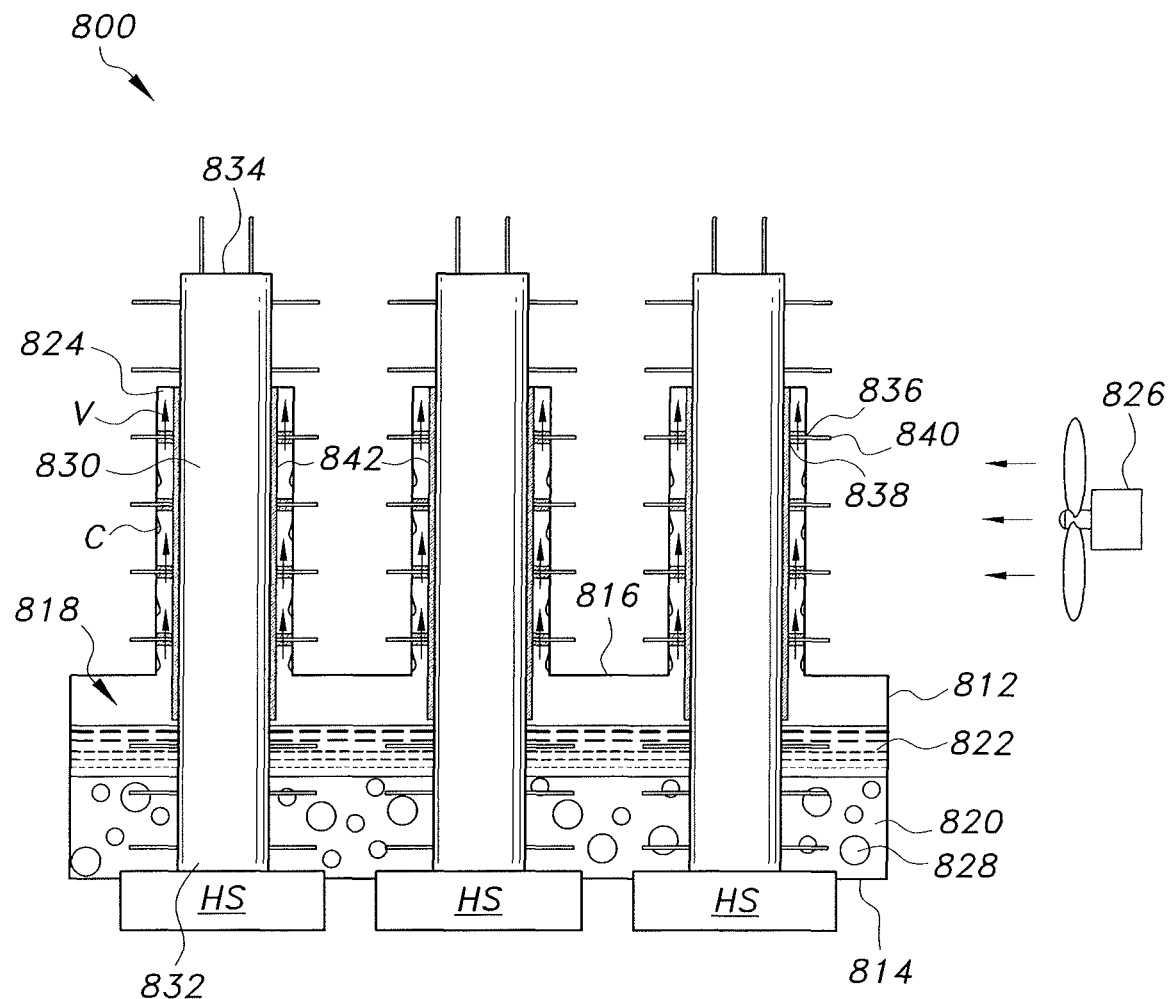
FIG. 9 is a side view in section of a heat sink with condensing fins and phase change material including at least one high thermal conductivity rod and a plurality of side beams, wherein each of the at least one high thermal conductivity rods extends through the portion of the thermally conductive housing forming each of the at least one condensing fins.

In the alternative embodiment of FIG. 9, the heat sink with condensing fins and phase change material, designated generally as 800, is formed from a thermally conductive housing 812, the thermally conductive housing 812 having a first wall 814 and an opposed second wall 816 and the thermally conductive housing forming an internal chamber 818. The first wall 814 of the thermally conductive housing 812 is adapted to be in direct contact with one or more heat sources HS. As shown in FIG. 9, three heat sources HS are present; however, it should be understood that any number of heat sources HS may be used. A high thermal conductivity medium 820 is disposed within the internal chamber 818, in direct contact with the first wall 814 of the thermally conductive housing 812 and opposite the one or more heat sources HS. A body of liquid phase change material 822 is disposed within the internal chamber 818, between the high thermal conductivity medium 820 and the second wall 816 of the thermally conductive housing 812. The second wall 816 of the thermally conductive housing 812 is adapted to form a plurality of condensing fins 824. In some embodiments, the exterior wall of the plurality of condensing fins 824 may be in direct contact with any type of external cooling fin generally known in the art (not shown). It should be understood that the overall configuration and relative dimensions of the thermally conductive housing 812, the high thermal conductivity medium 820, the body of liquid phase change material 822, and the plurality of condensing fins 824 are shown for purposes of illustration only.

As in the previous embodiment, at least one high thermal conductivity rod 830 having a first end 832 and an opposed second end 834 is disposed within the internal chamber 818. In the alternative embodiment of FIG. 9, the first end 832 of each of the at least one high thermal conductivity rods 830 extends through the high thermal conductivity medium 820 and is in direct contact with the first wall 814 of the thermally conductive housing 812 and/or the heat source HS. The second end 834 of each of the at least one high thermal conductivity rods 830 extends into and through one of the plurality of condensing fins 824. The second end 834 of each of the at least one high thermal conductivity rods 830 extends through the second wall 816 of the thermally conductive housing 812 and, thus, extends outside the thermally conductive housing 812. In an embodiment, the second end 834 of some of the high thermal conductivity rods extend through the thermally conductive housing 812 while others may not.

As in the previous embodiment, a plurality of side beams 836, having a first end 838 and an opposed second end 840, connect each of the at least one high thermal conductivity rods 830 to the second wall 816 of the thermally conductive housing. The first end 838 of each of the plurality of side beams 836 is attached to one of the at least one high thermal conductivity rods 830. At least some of the plurality of side beams 836 extends through the second wall 816 of the thermally conductive housing 812 and the second end 840 of each of the plurality of side beams 836 is outside the thermally conductive housing 812. The second end 840 of the rest of the plurality of side beams 836 may extend into the high thermal conductivity medium 820 or the body of liquid phase change material 822. There may additionally be side beams 836 on the portion of the at least one high thermal conductivity rods 830 outside the thermally conductive housing 812. The plurality of side beams 836 may be made of any high thermal conductivity material suitable for conducting heat.

As in the previous embodiments, an insulating material 842 may line some, or all, of the portion of the outer surface of at least one of the at least one high thermal conductivity rods 830 that is outside the high thermal conductivity medium 820 and the body of liquid phase change material 822 yet inside the thermally conductive housing 812. The insulating material 842 may be a ceramic coating, a thin film coating such as a nanomaterial, or the like. The insulating material 842 may also line none, some, or all, of the portion of the outer surface of the plurality of side beams 836 that is within the thermally conductive housing 812.

As in the previous embodiment, the insulating material 842 reduces heat exchange between both the at least one high thermal conductivity rod 830 and the plurality of side beams 836 and the vapor V, which could interfere with the rate of condensation.

In use, heat generated by the heat source HS is transferred, via conduction, through the thermally conductive housing 812 and into the high thermal conductivity medium 820. In addition to the heat transferred into the high thermal conductivity medium 820, heat can further be transferred from the high thermal conductivity medium 820 into the body of liquid phase change material 822. The heat may cause at least a portion of the body of liquid phase change material 822 to evaporate, and the vapor V may flow into the plurality of condensing fins 824, where the vapor V is cooled through heat exchange with the ambient environment. The rate of cooling may be enhanced by one or more fans 826 blowing air across the plurality of condensing fins 824. The cooling of the vapor V may condense the evaporated liquid phase change material into a condensate C, and the condensate C may drip, under the force of gravity, back into the at least one internal chamber 818 for reuse, thereby aiding in cooling the heat source HS.

The presence of the high thermal conductivity medium 820 may be particularly useful to prevent heat flux conditions at the first wall 814 from causing a vapor film to cover the first wall 814, which could in turn lead to damage to the heat source HS. The high thermal conductivity medium 820, when combined with the body of liquid phase change material 822, may enhance heat removal, thereby preventing heat flux conditions from causing potential damage to the heat source HS.

In the alternative embodiment of FIG. 9, heat may also be transferred by conduction from the heat source (HS), the high thermal conductivity medium 820, or the body of liquid phase change material 822, into the at least one high thermal conductivity rod 830, and from the at least one high thermal conductivity rod 830 into the body of liquid phase change material 822 and/or through the plurality of side beams 836, and into the second wall of the thermally conductive housing, thereby providing accelerated cooling of the heat source HS.

The phase change material comprising the body of liquid phase change material 822 is selected such that after forming a vapor V by exposure to heat from the heat source HS, the vapor V will condense back into a condensate C when exposed, through the plurality of condensing fins 824, to the conditions of the ambient environment within which the heat sink will be operating. The selection of the phase change material comprising the body of liquid phase change material 822 may depend upon a number of conditions, including anticipated pressure in the internal chamber 818, the external temperature during operation, and the surface area of each of the plurality of condensing fins 824. Under otherwise standard conditions, such as atmospheric temperature, the phase change material comprising the body of liquid phase change material 822 will have a boiling point slightly above the temperature of the ambient environment. By way of non-limiting example, where the plurality of condensing fins 824 has a larger surface area, the phase change material comprising the body of liquid phase change material 822 may be selected to have a boiling point 1° to 5° C. above the temperature of the ambient environment. By way of non-limiting example, where the plurality of condensing fins 824 has a smaller surface area, the phase change material comprising the body of liquid phase change material 822 may be selected to have a boiling point 5° to 10° C. above the temperature of the ambient environment.

Generally, the anticipated atmospheric temperature and the surface area of the plurality of condensing fins 824 will be the primary criteria used to select an appropriate phase change material for use in the body of liquid phase change material 822. Multiple phase change materials having different boiling points within the desired range of operation may be mixed in the body of liquid phase change material 822 in order to smooth the temperature range of phase change under varying ambient conditions. The pressure of the internal chamber 818 may also be adjusted to optimize the boiling point of the selected liquid phase change material for a particular intended use.

Non-limiting examples of liquid phase change materials suitable for use in the body of liquid phase change material 822 include one or more of water, formic acid, caprylic acid, glycerin, acetic acid, polyethylene glycol 600, n-hexadecane and n-heptadecane.

As in the previous embodiment, the material for use in the high thermal conductivity medium 820 may be a phase change material. If the material for use in the high thermal conductivity medium 820 is not a phase change material, a suitable material may be selected with a particularly high thermal conductivity, such as copper, aluminum, or the like. If the material for use in the high thermal conductivity medium 820 is a phase change material, the phase change material for use in the high thermal conductivity medium 820 is selected such that it has a melting temperature between the operating temperature of the heat sink 800 and the boiling temperature of the at least one liquid phase change material 822. Multiple phase change materials having different melting points within the desired range of operation may be mixed in the high thermal conductivity medium 820 in order to smooth the temperature range of phase change under varying ambient conditions. Non-limiting examples of solid phase change materials suitable for use in the high thermal conductivity medium 820 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

If a phase change material is used to form the high thermal conductivity medium 820, the heat from the heat source HS may also cause at least a portion of the high thermal conductivity medium 820 to melt. The high thermal conductivity medium 820 will thus absorb and store additional heat until it can be transferred to the body of liquid phase change material 818, cooling the melted portion of the high thermal conductivity medium 820 and allowing it to freeze. It should be understood that in use the high thermal conductivity medium 820 may be in a solid state, a partially melted state, or a liquid state.

It should be further understood that in use the body of liquid phase change material 822 may be in a liquid state, a partially gaseous state, or a gaseous state.

As shown in the previous embodiment, the heat sink with condensing fins and phase change material 800 may include at least one encapsulated phase change material 828 disposed within the high thermal conductivity medium 820. The at least one encapsulated phase change material 828 may be a liquid phase change material or a solid phase change material. The materials selected to encapsulate the at least one encapsulated phase change material 828 may be chosen to expand in size when subjected to increased internal pressure and/or increased temperature and to contract in size when subjected to reduced internal pressure and/or decreased temperature. The at least one encapsulated phase change material 828 may include nano, micro, or meso sized particles, or a combination thereof. The use of varying materials or varying sizes of the at least one encapsulated phase change material 828 may prevent clustering of the at least one encapsulated phase change material 828 particles. The concentration of the at least one encapsulated phase change material 828 particles may be varied to optimize performance.

In use, the at least one encapsulated phase change material will absorb and store heat from the high thermal conductivity medium 820. The at least one encapsulated phase change material 828 will be particularly useful where the high thermal conductivity medium 820 is either partially or entirely melted. The at least one encapsulated phase change material 828 will initially be sufficiently dense to remain near the bottom of the high thermal conductivity medium 820. Should the high thermal conductivity medium 820 remain in the solid state, the at least one encapsulated phase change material 828 will remain as is. However, as the high thermal conductivity medium 820 melts and transitions to a liquid state, this will permit the at least one encapsulated phase change material 828 to heat up and change phase. This can cause the material encapsulating the at least one encapsulated phase change material 828 to be subjected to increased internal pressure and increased heat, and thus begin to expand. As the material encapsulating the at least one encapsulated phase change material 828 expands, it's buoyancy force will increase and the at least one encapsulated phase change material 828 will begin to rise through the melted high thermal conductivity medium 820, until the at least one encapsulated phase change material 828 encounters a cooler region of high thermal conductivity medium 820 and begins to cool/shrink, causing the at least one encapsulated phase change material 828 to eventually sink back to the lower portion of the high thermal conductivity medium 820. The at least one encapsulated phase change material 828 may also rise into the body of liquid phase change material 822, before cooling and shrinking in size sufficiently to return to the lower portion of the high thermal conductivity medium 820. This process increases the rate of heat transfer from the portion of the high thermal conductivity medium 820 near the heat source HS to the portion of the high thermal conductivity medium 820 near the body of liquid phase change material 822, partially due to agitation and mixing of the high thermal conductivity medium 820.

The materials selected to encapsulate the at least one encapsulated phase change material 828 may further be selected to optimize ascending and descending behavior of the at least one encapsulated phase change material 828 under specific targeted operating conditions (such as anticipated temperature of the high thermal conductivity medium 820 while operating). The size and kind of phase change material used for the at least one encapsulated phase change material 828 may vary, thus varying the temperature and/or the amount of heat captured or given off by the at least one encapsulated phase change material 828 required to cause the at least one encapsulated phase change material 828 to ascend or descend, and thereby maximizing the level of mixing and agitation of the high thermal conductivity medium 820 and of the interface between the high thermal conductivity medium 820 and the body of liquid phase change material 822. This dynamic agitation will assist in ensuring that the at least one encapsulated phase change material 828 does not aggregate at the interface of the high thermal conductivity medium 820 and the body of liquid phase change material 822.

In the alternative embodiment of FIG. 9, the second end 834 of each of the at least one high thermal conductivity rods 830 acts as a further cooling fin, as it is directly exposed to the external environment, thereby dramatically increasing the rate of heat transfer through each of the at least one high thermal conductivity rods 830. This embodiment may be particularly useful where the heat source HS displays high heat flux and requires a high cooling rate.

If present, the phase change material used in the at least one encapsulated phase change material 828 is selected such that it has a phase change temperature between the highest boiling temperature of the phase change materials used in the body of liquid phase change material 822 and the highest melting temperature of phase change materials used in the high thermal conductivity medium 820. Non-limiting examples of liquid phase change materials useful as encapsulated phase change materials 828 include one or more of water, formic acid, caprylic acid, glycerin, acetic acid, polyethylene glycol 600, n-hexadecane and n-heptadecane. Non-limiting examples of solid phase change materials useful as encapsulated phase change materials 828 include one or more of elemental gallium, gallium alloys of liquid metals or the like, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

Features of each of the disclosed embodiments may be used in other of the disclosed embodiments. For example, the optional thermally conductive component of the embodiment of FIG. 3 can be used in the embodiment of FIG. 2, and so on.

It is to be understood that the heat sink with condensing fins is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

I claim:

1. A heat sink with condensing fins and phase change material, comprising:
   a thermally conductive housing, the thermally conductive housing forming an internal chamber, the thermally conductive housing having a first wall and an opposed second wall;
   at least one heat source in contact with the first wall of the thermally conductive housing;
   a thermal conductivity medium disposed within the internal chamber and in direct contact with the first wall of the thermally conductive housing;

a body of liquid phase change material disposed within the internal chamber and in direct contact with the thermal conductivity medium;

the second wall of the thermally conductive housing being configured to form a plurality of spaced apart condensing fins;

a plurality of thermal conductivity rods, each of the plurality of thermal conductivity rods having a first end and an opposed second end, the first end of each of the plurality of thermal conductivity rods being disposed in the thermal conductivity medium and spaced from the first wall of the thermally conductive housing and the second end of the each of the plurality of thermal conductivity rods extending into a respective one of the plurality of spaced apart condensing fins; and a plurality of thermally conductive side beams, each of the plurality of side beams having a first end and an opposed second end, each of the plurality of thermally conductive side beams being attached to at least a respective second end of each of the plurality of thermal conductivity rods.

2. The heat sink with condensing fins and phase change material according to claim 1, further comprising an encapsulated phase change material disposed within the thermal conductivity medium, wherein the encapsulated phase change material is encapsulated in a material capable of expansion and contraction.

3. A heat sink with condensing fins and phase change material according to claim 1, further comprising a thermally conductive component disposed within a portion of the internal chamber.

4. A heat sink with condensing fins and phase change material according to claim 3, wherein the thermally conductive component is selected from the group consisting of a thermally conductive foam, a thermally conductive matrix, a thermally conductive grid, and a thermally conductive mesh.

5. A heat sink with condensing fins and phase change material according to claim 1, wherein:

the second end of each of the plurality of side beams being attached to the second wall of the thermally conductive housing.

6. The heat sink with condensing fins and phase change material according to claim 1, wherein the second end of each of the plurality of side beams extends through the second wall of the thermally conductive housing.

7. The heat sink with condensing fins and phase change material according to claim 6, further comprising an internal chamber within each of the plurality of thermal conductivity rods, each of the internal chambers within each of the plurality of thermal conductivity rods extending from the first end of each of the plurality of thermal conductivity rods to the second end of each of the plurality of thermal conductivity rods; wherein the internal chamber allows vapor to rise from the first end of each of the plurality of thermal conductivity rods to the second end of each of the plurality of thermal conductivity rods.

8. The heat sink with condensing fins and phase change material according to claim 7, further comprising at least one access point in each of the plurality of thermal conductivity rods, wherein each of the at least one access points places each of the internal chambers of each of the plurality of thermal conductivity rods in open fluid communication with the body of liquid phase change material.

9. The heat sink with condensing fins and phase change material according to claim 8, further comprising wherein the at least one access point in each of the plurality of thermal conductivity rods provides a vapor jet disposed in the portion of the plurality of thermal conductivity rods extending into one of the plurality of condensing fins.

10. The heat sink with condensing fins and phase change material according to claim 1, further comprising an insulating material lining a portion of an outer surface of at least the second end at least one of each of the thermal conductivity rods.

11. The heat sink with condensing fins and phase change material according to claim 1, further comprising an insulating material lining an outer surface of at least the second end of each of the plurality of side beams.

12. A heat sink with condensing fins and phase change material, comprising:

a thermally conductive housing, the thermally conductive housing forming at least one internal chamber, the thermally conductive housing having a first wall and an opposed second wall, and the opposed second wall being configured to form a plurality of spaced apart condensing fins;

at least one heat source in contact with the first wall of the thermally conductive housing;

a body of liquid phase change material disposed within the at least one internal chamber;

a plurality of thermal conductivity rods, each of the plurality of thermal conductivity rods having a first end and an opposed second end, the second end of each of the plurality of thermal conductivity rods extending into a respective one of the plurality of condensing fins, an insulating material lining a portion of an outer surface of a respective second end of each of the plurality of thermal conductivity rods; and a plurality of side beams, the plurality of side beams each having a first end and an opposed second end, the first end of each of the plurality of side beams being affixed to a respective one of the plurality of thermal conductivity rods and the second end of each of the plurality of side beams being disposed in direct contact with the portion of the thermally conductive housing forming the opposed second wall.

13. The heat sink with condensing fins and phase change material according to claim 12, wherein the first end of each of the plurality of thermal conductivity rods is disposed in the body of liquid phase change material.

* * * * *